US010811637B2

(12) United States Patent
Choi et al.

(10) Patent No.: US 10,811,637 B2
(45) Date of Patent: Oct. 20, 2020

(54) DISPLAY DEVICE AND METHOD OF MANUFACTURING THE SAME

(71) Applicant: Samsung Display Co., Ltd., Yongin-si, Gyeonggi-do (KR)

(72) Inventors: Jung Ho Choi, Yongin-si (KR); June Woo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/058,622

(22) Filed: Aug. 8, 2018

(65) Prior Publication Data

US 2019/0165318 A1 May 30, 2019

(30) Foreign Application Priority Data

Nov. 24, 2017 (KR) .................. 10-2017-0157901

(51) Int. Cl.
| | | |
|---|---|---|
| H01L 51/52 | (2006.01) | |
| H01L 27/32 | (2006.01) | |
| H01L 27/12 | (2006.01) | |
| H01L 51/56 | (2006.01) | |

(52) U.S. Cl.
CPC ........ *H01L 51/5268* (2013.01); *H01L 27/322* (2013.01); *H01L 27/3246* (2013.01); *H01L 27/3248* (2013.01); *H01L 27/3258* (2013.01); *H01L 27/3262* (2013.01); *H01L 51/5209* (2013.01); *H01L 51/5225* (2013.01); *H01L 51/5253* (2013.01); *H01L 51/56* (2013.01); *H01L 27/1248* (2013.01); *H01L 27/3211* (2013.01); *H01L 2227/323* (2013.01); *H01L 2251/558* (2013.01)

(58) Field of Classification Search
CPC ............. H01L 51/5268; H01L 51/5209; H01L 51/5225; H01L 27/322; H01L 27/3246; H01L 27/3248; H01L 27/3258; H01L 27/1248
See application file for complete search history.

(56) References Cited

U.S. PATENT DOCUMENTS

| | | | |
|---|---|---|---|
| 2014/0306241 | A1 | 10/2014 | Hirakata et al. |
| 2017/0092705 | A1 | 3/2017 | Lim et al. |
| 2018/0190719 | A1 | 7/2018 | Kim et al. |
| 2018/0211979 | A1* | 7/2018 | Lee .................. H01L 51/502 |

FOREIGN PATENT DOCUMENTS

| | | |
|---|---|---|
| KR | 10-2016-0116159 A | 10/2016 |
| KR | 10-1707116 B1 | 2/2017 |
| KR | 10-2017-0027267 A | 3/2017 |
| KR | 10-2017-0038951 A | 4/2017 |

OTHER PUBLICATIONS

Extended European Search Report for corresponding European Application No. 18196440.4, dated Mar. 19, 2019; 7 pages.

* cited by examiner

*Primary Examiner* — Thanhha S Pham
(74) *Attorney, Agent, or Firm* — Lewis Roca Rothgerber Christie LLP

(57) ABSTRACT

A display device includes a base substrate, an organic layer on the base substrate and including a pattern region having an uneven pattern formed thereon, and a non-pattern region having a substantially flat surface, a light-emitting element on the organic layer, and a color conversion pattern on the light-emitting element and overlapping the pattern region and the non-pattern region.

24 Claims, 24 Drawing Sheets

DISPLAY DEVICE AND METHOD OF MANUFACTURING THE SAME

CROSS-REFERENCE TO RELATED APPLICATION

This application claims priority to Korean Patent Application No. 10-2017-0157901, filed on Nov. 24, 2017, in the Korean Intellectual Property Office, the disclosure of which is incorporated by reference herein in its entirety.

BACKGROUND

1. Field

Aspects of the present invention relate to a display device and a method of manufacturing a display device.

2. Description of the Related Art

A display device, for example, an organic light-emitting display device, includes an organic light-emitting element, which is a self-luminous element. The organic light-emitting element may include two opposing electrodes, and an organic light-emitting layer interposed therebetween. Electrons and holes provided from the two electrodes are recombined in the light-emitting layer to generate excitons, the generated excitons change from an excited state to a ground state, and light may be emitted.

Because such an organic light-emitting display device does not require a separate light source, the organic light-emitting display device may be configured in a lightweight and thin profile with a low power consumption, and the organic light-emitting display device may have high quality characteristics, such as a wide viewing angle, high brightness and contrast, and fast response speed. Thus, the organic light-emitting display device has attracted attention as a next generation display device.

On the other hand, as one method for allowing each pixel of the display device including the light-emitting element to uniquely express one basic color, a method of arranging a color conversion pattern on a light path leading to a viewer from the light-emitting element may be exemplified. For example, the light after passing through the color conversion pattern may exhibit a specific wavelength band.

The above information disclosed in this Background section is only for enhancement of understanding of the background of the invention and therefore it may contain information that does not form prior art.

SUMMARY

The color conversion pattern converts the color of the incident light and may emit light of a color different from the incident light. The color conversion efficiency by the color conversion pattern is an important factor that may affect the display quality of the display device, for example, by affecting color reproducibility and luminance. As a method of enhancing the color conversion efficiency by the color conversion pattern, a method of using a material having excellent color conversion efficiency or a method of increasing the thickness of the color conversion pattern may be exemplified. However, there is a limit to increasing the efficiency of the color conversion material and the thickness of the color conversion pattern.

Aspects of embodiments of the present invention are directed to a display device with improved color reproducibility and luminance through a structure capable of improving the color conversion efficiency by the color conversion pattern.

Other aspects of embodiments of the present invention are directed to a display device in which a color mixing defect between adjacent pixels is prevented or reduced, and a display quality is improved.

However, aspects of embodiments of the present invention are not restricted to the one set forth herein. The above and other aspects of the present invention will become more apparent to one of ordinary skill in the art to which the present invention pertains by referencing the detailed description of the present invention given below.

According to an exemplary embodiment of the invention, there is provided a display device including: a base substrate; an organic layer on the base substrate and including a pattern region having an uneven pattern formed thereon, and a non-pattern region having a substantially flat surface; a light-emitting element on the organic layer; and a color conversion pattern on the light-emitting element and overlapping the pattern region and the non-pattern region.

In some embodiments, the display device includes a light-emitting region and a non-light-emitting region, wherein the pattern region is in the light-emitting region, and wherein at least a part of the non-pattern region is in the light-emitting region, and at least a part of the non-pattern region is located in the non-light-emitting region.

In some embodiments, the display device further includes: a pixel defining layer between the organic layer and the color conversion pattern and defining an opening corresponding to the light-emitting region, wherein the pixel defining layer does not overlap the uneven pattern.

In some embodiments, a horizontal distance between a side surface of the pixel defining layer and the uneven pattern is 0.5 times or more of a minimum distance between the light-emitting element and the color conversion pattern.

In some embodiments, the horizontal distance between the side surface of the pixel defining layer and the uneven pattern is 10% or more of a width of the light-emitting region.

In some embodiments, the pixel defining layer partially overlaps the color conversion pattern.

In some embodiments, the display device includes a first pixel and a second pixel adjacent to the first pixel, and a minimum distance between the uneven pattern of the organic layer in the first pixel and the uneven pattern of the organic layer in the second pixel is 1.5 times or more of the minimum distance between the light-emitting element and the color conversion pattern.

In some embodiments, the display device further includes: a thin film transistor between the base substrate and the organic layer, wherein the organic layer has a through-hole enabling an electrical connection between the light-emitting element and the thin film transistor, and a width on a plane of the through-hole is 5 times or more of a width on a plane of the uneven pattern.

In some embodiments, the organic layer includes a positive photosensitive material.

In some embodiments, the width of the uneven pattern is 2.5 μm or less.

In some embodiments, a distance between adjacent uneven patterns among a plurality of uneven patterns arranged in any pixel is 0.5 times or more of the width of the uneven pattern.

In some embodiments, the uneven pattern is a linear or dot-shaped recess pattern, and a depth of the recess pattern is about 2.0 μm or less.

In some embodiments, the organic layer includes a first organic layer, and a second organic layer between the first organic layer and the light-emitting element, wherein a surface of the first organic layer that is in contact with the second organic layer is substantially flat, and wherein the second organic layer has the uneven pattern.

In some embodiments, the uneven pattern of the second organic layer is a recess pattern of a dot shape on a plane, and the second organic layer includes a positive photosensitive material.

In some embodiments, the display device further includes: a pixel defining layer between the organic layer and the color conversion pattern and defining an opening corresponding to a pixel of the display device, wherein the recess pattern of the second organic layer partially exposes a flat surface of the first organic layer, and wherein the non-pattern region of the second organic layer is in partial contact with the pixel defining layer.

In some embodiments, the uneven pattern of the second organic layer is a dot-shaped convex pattern on a plane, and the second organic layer includes a negative photosensitive material.

In some embodiments, the display device further includes: a pixel defining layer between the organic layer and the color conversion pattern and defining an opening corresponding to a pixel of the display device, wherein a flat surface of the first organic layer is in contact with the pixel defining layer.

In some embodiments, the light-emitting element includes a first electrode and a second electrode opposed to each other, and an organic light-emitting layer interposed therebetween, and one or more of the first electrode and the second electrode has an uneven surface which overlaps the uneven pattern of the organic layer and has a shape corresponding to the uneven pattern.

In some embodiments, the display device further includes: an encapsulation layer between the light-emitting element and the color conversion pattern and including one or more organic layers and one or more inorganic layers; a barrier layer between the encapsulation layer and the color conversion pattern, the barrier layer being arranged along a surface of the color conversion pattern, and including an inorganic material; and an adhesive layer between the encapsulation layer and the barrier layer and in contact with the inorganic layer of the encapsulation layer and the barrier layer, wherein the light-emitting element includes a first electrode in contact with the organic layer, a second electrode on the first electrode, and an organic light-emitting layer interposed between the first electrode and the second electrode.

In some embodiments, a lowermost layer of the encapsulation layer that is in contact with the second electrode has a partially uneven surface.

In some embodiments, the organic light-emitting layer includes: a first light-emitting layer between the first electrode and the second electrode and configured to emit light having a peak wavelength in a range of about 420 nm to about 490 nm, and a second light-emitting layer between the first light-emitting layer and the second electrode, and configured to emit light having a peak wavelength in the range of about 420 nm to about 490 nm and having a peak wavelength different from that of the first light-emitting layer.

In some embodiments, the display device includes a first pixel, and a second pixel configured to display a color different from the first pixel, the organic light-emitting layer is configured to emit light of a blue wavelength band having a peak wavelength in a range of about 420 nm to about 490 nm, and the organic light-emitting layer is above the first pixel and the second pixel.

In some embodiments, the light-emitting element includes an anode electrode, a cathode electrode, and an organic light-emitting layer interposed therebetween, and the cathode electrode and the color conversion pattern are apart from each other with the anode electrode interposed therebetween.

According to an exemplary embodiment of the invention, there is provided a display device having a plurality of pixels, the display device including: a base substrate; a light-emitting element on the base substrate, and including a first electrode, a second electrode, and an organic light-emitting layer interposed therebetween; and a pixel defining layer on the base substrate and defining an opening corresponding to the pixel, wherein the first electrode has a pattern region in which a plurality of uneven patterns are formed, and a non-pattern region having a substantially flat surface, and wherein the non-pattern region is at least partially between the pattern region and the pixel defining layer.

According to an exemplary embodiment of the invention, there is provided a method of manufacturing a display device, the method including: forming a thin film transistor on a base substrate; forming an organic layer on the thin film transistor, the organic layer including a pattern region with an uneven pattern formed thereon, and a non-pattern region having a substantially flat surface, the organic layer having a through-hole partially exposing the thin film transistor; forming a light-emitting element on the organic layer; and forming a color conversion pattern on the light-emitting element to overlap the pattern region and the non-pattern region.

In some embodiments, the formation of the organic layer includes: providing an organic material including a positive photosensitive material on the thin film transistor; and concurrently forming the through-hole and the uneven pattern, using one mask, wherein the uneven pattern is a recess pattern, and a width on a plane of the recess pattern is about 2.5 μm or less.

In some embodiments, the formation of the organic layer includes: forming a first organic layer having a substantially flat surface on the thin film transistor; and forming a second organic layer including a negative photosensitive material and having the uneven pattern on the first organic layer, wherein the uneven pattern includes a convex pattern.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art.

Hereinafter, embodiments of the present invention will be described with reference to the accompanying drawings.

Figure 1:
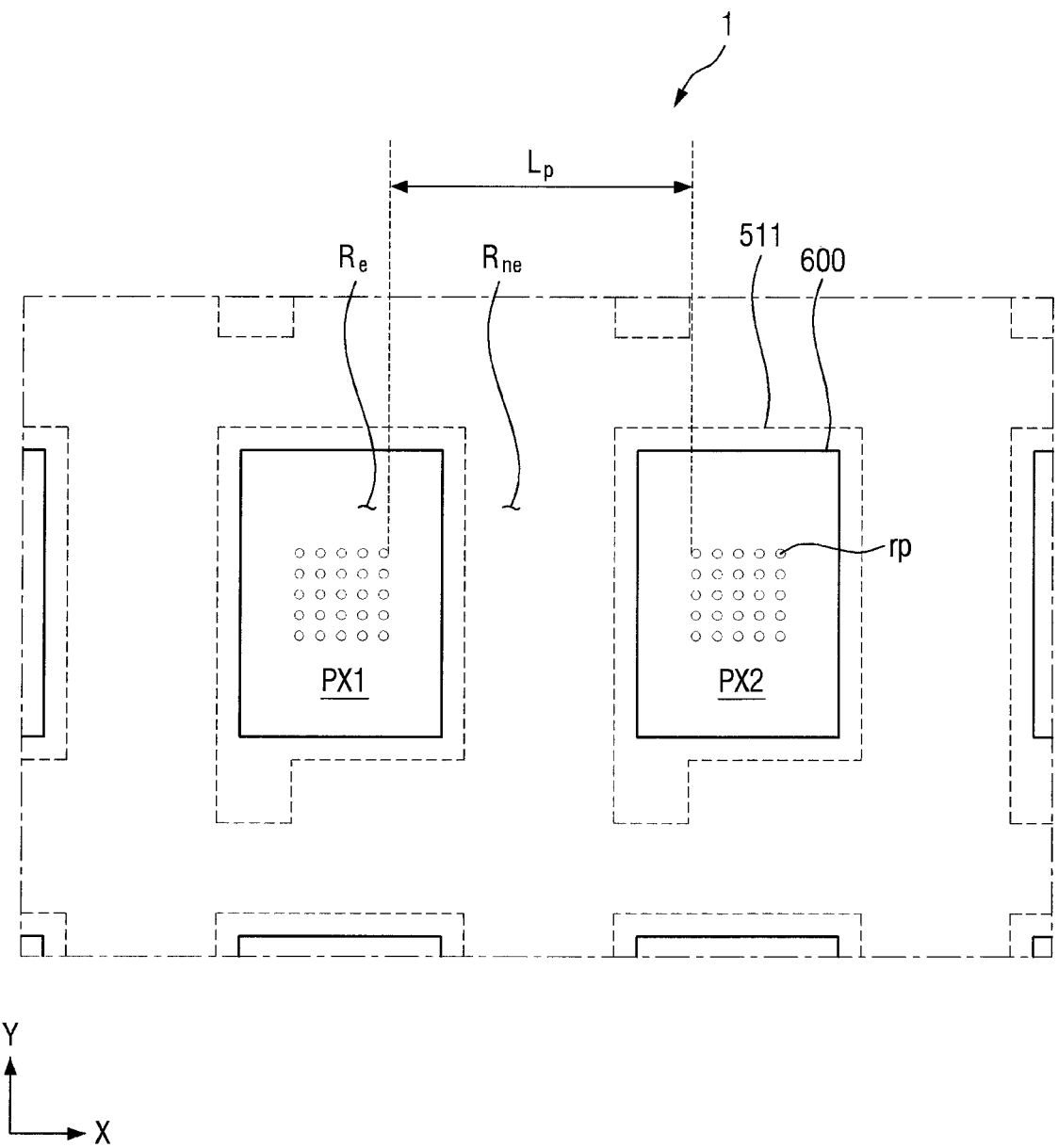
FIG. 1 is a layout view of arbitrary pixels of a display device according to an embodiment of the present invention.

FIG. 1 is a layout view of arbitrary pixels of a display device according to an embodiment of the present invention, illustrating an uneven pattern (rp), a first electrode 511, and a pixel defining layer 600.

First, referring to FIG. 1, a plurality of pixels (PX1, PX2) may be defined in the display device 1. In this specification, the term "pixel" refers to a single region in which the display region is partitioned on a plane viewpoint for displaying colors and recognized by the viewer, and one pixel may express one predefined basic color. That is, one pixel may be a minimum unit in the display device 1 capable of expressing colors independent of other pixels. The plurality of pixels (PX1, PX2) may be arranged in an approximately matrix form on a plane along a first direction X and a second direction Y. In the present specification, unless otherwise defined, the term "plane" refers to a plane on which the first direction X and the second direction Y reside.

In an exemplary embodiment, the plurality of pixels (PX1, PX2) may include a first pixel (PX1) displaying a first color, and a second pixel (PX2) displaying a second color having a peak wavelength that is longer than the first color. In some embodiments, the first pixel (PX1) and the second pixel (PX2) may be disposed to be adjacent to each other. For example, the first pixel (PX1) may be a pixel which displays a blue color having a peak wavelength in the range of about 420 nanometers (nm) to about 490 nm, and the second pixel (PX2) may be a pixel that displays a green color having a peak wavelength in the range of about 530 nm to about 570 nm or a red color having a peak wavelength in the range of about 610 nm to about 650 nm.

The uneven pattern (rp) may be arranged substantially at the central parts of each pixel (PX1, PX2). The uneven pattern (rp) may be a dot-shaped pattern of approximately circular shape on the plane. The uneven pattern (rp) may include a first uneven pattern 401r of the organic layer 401, a second uneven pattern 511r of the first electrode 511, and/or a third uneven pattern 531r of the second electrode 531 to be described further with reference to FIG. 2 and other figures.

Hereinafter, the display device 1 will be described in detail with further reference to FIGS. 2 to 4.

Figure 2:
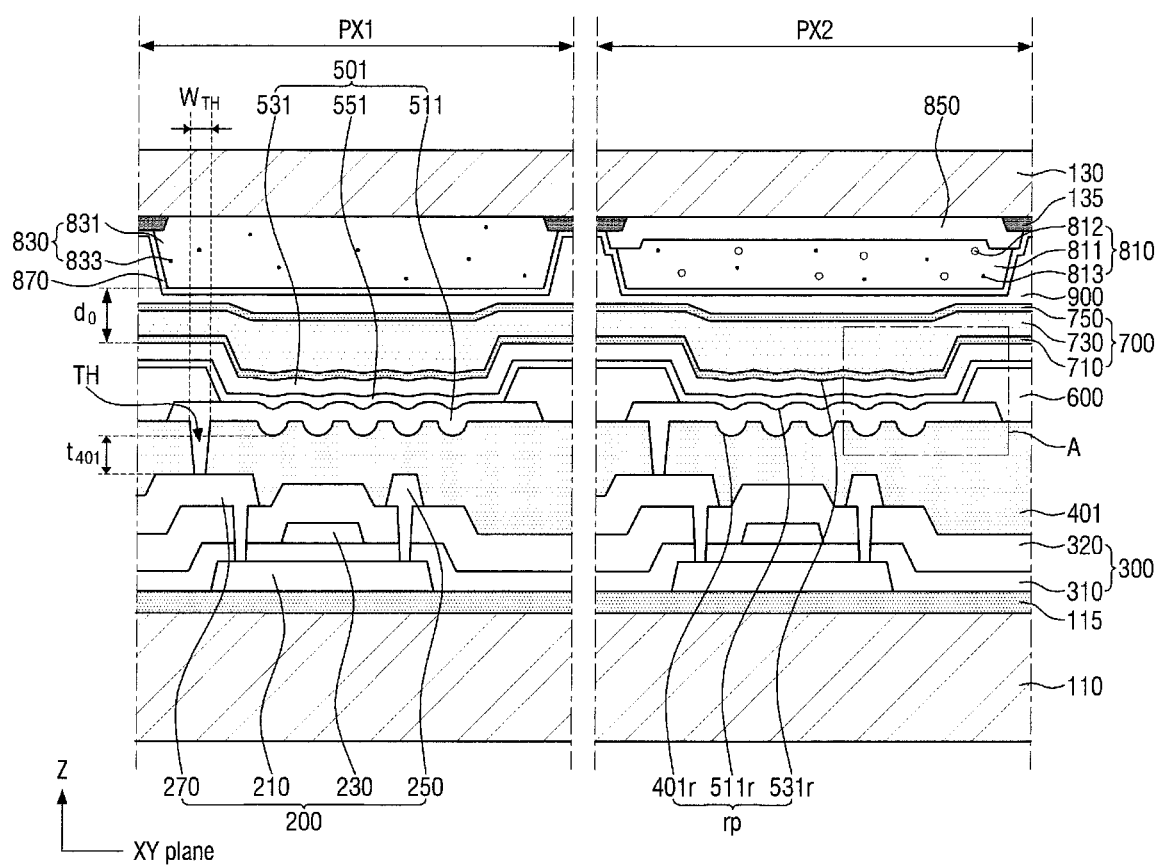
FIG. 2 is a cross-sectional view of the display device of FIG. 1.

FIG. 2 is a cross-sectional view of the display device of FIG. 1, illustrating the first pixel (PX1) and the second pixel (PX2) of the display device 1. FIG. 3 is a cross-sectional view illustrating the region A of FIG. 2 in an enlarged manner. FIG. 4 is a cross-sectional view illustrating the light-emitting element of FIG. 2.

Referring to FIGS. 1 to 4, the display device 1 includes a base substrate 110, driving element layers 200 and 300, and a light-emitting element 501, and may further include color conversion patterns 810 and 830.

The base substrate 110 may be a transparent or opaque insulating substrate or an insulating film. For example, the base substrate 110 may be made of a glass material, a quartz material, and/or the like, or may be made up of a flexible polymeric material such as polyimide, polycarbonate, polyethylene terephthalate, polyacrylate, and/or the like. The base substrate 110 may also be flexible.

In some embodiments, a buffer layer 115 may be disposed on one surface (e.g., an upper surface of FIG. 2) of the base substrate 110. The buffer layer 115 may prevent the base substrate 110 from being damaged, or reduce damage to the base substrate 110, during the process of manufacturing an active layer 210. Further, the buffer layer 115 may prevent impurities, such as moisture and air, from penetrating and damaging or denaturalizing the light-emitting element 501 or reduce instances thereof. The buffer layer 115 may be made of an inorganic material such as silicon nitride (SiNx), silicon oxide (SiOx), silicon nitride oxide (SiNxOy), silicon oxynitride (SiOxNy), and/or the like. The buffer layer 115 may be made up of a single layer or may have a stacked structure made of several layers. In another embodiment, the buffer layer 115 may be omitted.

Driving element layers 200 and 300 including a thin film transistor 200 and a plurality of insulating layers 310 may be disposed on the buffer layer 115. In some embodiments, the driving element layers 200 and 300 may further include an additional transistor, auxiliary electrodes, and wirings such as an injection signal line, a data signal line, and a drive voltage line.

The thin film transistor 200 may be a driving transistor configured to control the amount of current flowing through a channel region in the active layer 210 in accordance with the signal applied to the control terminal, and control the amount of light emission the light-emitting element 501 in the specific pixel. For example, the thin film transistor 200 may include a gate electrode 230 as a control terminal, a drain electrode 250 as an input terminal, a source electrode 270 as an output terminal, and an active layer 210 for providing a channel. FIG. 2 and the like illustrate a top gate type thin film transistor in which the gate electrode 230 is located above the active layer 210; however, in another embodiment, a bottom gate type thin film transistor may be adopted.

The active layer 210 may be disposed on the buffer layer 115. The active layer 210 may include a semiconductor material. For example, the active layer 210 may include polycrystalline silicon. In other embodiments, the active layer 210 may include monocrystalline silicon, or amorphous silicon, and/or a non-silicon-based semiconductor material such as an oxide semiconductor.

The active layer 210 may include a channel region, a drain region, and a source region. The channel region may be a region in which a path (e.g., a channel) is formed, through which electrons or holes can move in accordance with a voltage applied to the gate electrode 230 (e.g., a control terminal). That is, the electrons or holes provided through the drain region may move toward the source region through the channel region, or the electrons or holes provided through the source region may move to the drain region through the channel region. The drain region and the source region may be spaced apart from each other with the channel region interposed therebetween. The electric conductivity of each of the drain region and the source region may be larger than that of the channel region. The drain region is electrically connected to a drain electrode 250 to which an input signal is applied, and the source region may be electrically connected to a source electrode 270. In the present specification, the expression "electrically connected" refers to not only a case where the two conductive elements are conductively connected by being in direct contact with each other, but also a case where the two conductive elements are conductively connected by interposing a conductive element between the two elements, and a case where the two conductive elements are selectively conductively connected by interposing a switching element such as one or more thin film transistors.

A gate electrode 230 may be disposed on the active layer 210. The gate electrode 230 may be disposed to overlap the channel region of the active layer 210 in a third direction Z. The gate electrode 230 may be electrically connected to an output electrode of a switching transistor that controls on/off of a specific pixel. A control terminal and an input terminal of the switching transistor are electrically connected to a scanning signal line and a data signal line, respectively, and the switching transistor may be configured such that the output terminal is turned on/off in accordance with the signal applied to the control terminal.

A first insulating layer 310 is interposed between the active layer 210 and the gate electrode 230 so that the active layer 210 and the gate electrode 230 can be insulated from each other. The first insulating layer 310 may be made of an inorganic insulating material such as silicon nitride, silicon oxide, silicon nitride oxide, silicon oxynitride, and/or the like.

A second insulating layer 320 may be disposed on the gate electrode 230. The second insulating layer 320 may insulate the gate electrode 230 and its upper components from each other. In some embodiments, the second insulating layer 320 may be a stacked structure of a plurality of insulating layers. The second insulating layer 320 may include an inorganic insulating material such as silicon nitride, silicon oxide, silicon nitride oxide or silicon oxynitride.

Through-holes (or openings) may be formed in the first insulating layer 310 and the second insulating layer 320 to expose at least a part of the active layer 210. For example, the through-hole may penetrate through the first insulating layer 310 and the second insulating layer 320 to partially expose the drain region and the source region of the active layer 210.

A drain electrode 250 and a source electrode 270 may be disposed on the second insulating layer 320. Each of the drain electrode 250 and the source electrode 270 may be inserted into the through-hole and may be in contact with the active layer 210. The drain electrode 250 is electrically connected to a driving voltage line, and the source electrode 270 may be electrically connected to a first electrode 511.

The organic layer 401 may be disposed on the driving element layers 200 and 300. The organic layer 401 protects the constituent elements in the driving element layers 200 and 300 disposed on the base substrate 110, for example, the thin film transistor 200, the auxiliary electrodes and/or the wirings, and may reduce or minimize the level difference formed by these constituent elements. That is, the organic layer 401 is disposed on the driving element layers 200 and 300, and may at least partially compensate for and flatten the level difference. In some embodiments, the organic layer 401 may have a stacked structure of a plurality of organic layers. The organic layer 401 is not particularly limited as long as it is a material having insulating properties and flattening properties, and it may include an acrylic resin, an epoxy resin, an imide resin, a cardo resin, an ester resin, and/or the like. The organic layer 401 may include a positive photosensitive material or a negative photosensitive material.

In the organic layer 401, a through-hole (TH) (or opening) through which at least a part of the source electrode 270 is exposed may be formed. The first electrode 511 of the light-emitting element 501 is inserted into the through-hole (TH) of the organic layer 401 and may be in contact with the source electrode 270. The through-hole (TH) of the organic layer 401 may be approximately circular from a plan view. A width ($W_{TH}$) on the plane of the through-hole (TH) of the organic layer 401 may be about 4.0 micrometers (μm) to about 20.0 μm, or about 10.0 μm to about 15.0 μm.

In an exemplary embodiment, one side (e.g., an upper surface of FIG. 2) of the organic layer 401 facing the light-emitting element 501 may have a partially uneven surface. That is, the organic layer 401 may have a first uneven pattern 401r. The first uneven pattern 401r may be located substantially at the central part of a light-emitting region ($R_e$), from a plan view. Further, the organic layer 401 may further have a flat surface having no uneven features. The flat surface of the organic layer 401 overlaps a pixel defining layer 600 and may form a top surface (e.g., a peak surface) having the highest level on the upper surface of the organic layer 401. In some embodiments, the flat surface of the organic layer 401 may be partially in contact with the first electrode 511 and the pixel defining layer 600.

The first uneven pattern 401r may be a dot-shaped pattern having an approximately circular shape on a plane; however, the present invention is not limited thereto. Further, the first uneven pattern 401r may be a recess pattern which is recessed downward from the reference surface of the organic layer 401 (e.g., the flat surface of the organic layer 401 or the aforementioned top surface). The first uneven pattern 401r may be a scattering pattern that partially scatters the transmitted light.

The size of the first uneven pattern 401r is not particularly limited as long as it may cause the light scattering. However, in the case where the first uneven pattern 401r is a recess pattern, the upper limit of the depth ($P_r$) of the first uneven pattern (410r) may be about 2.0 μm, about 1.0 μm, or about 0.5 μm. When the depth ($P_r$) of the first uneven pattern 401r is within the above range, the light scattered by the first uneven pattern 401r is scattered at an angle, for example, at an angle of about 60 degrees or less with respect to the normal line of the upper surface of the organic layer 401, to the extent that the light does not enter other pixels and it is possible to increase the length of the path of the light transmitting the color conversion patterns 810 and 830. Further, when the depth ($P_r$) of the first uneven pattern 401r is within the above range, sufficient thickness of the organic layer 401 can be secured and the display device 1 can be normally driven. The lower limit of the depth ($P_r$) of the first uneven pattern 401r is not particularly limited, and may be, for example, about 0.05 μm.

In some embodiments, the minimum thickness ($t_{401}$) of the organic layer 401 is about 0.5 μm or more, about 0.6 μm or more, about 0.7 μm or more, about 0.8 μm or more, about 0.9 μm or more, or about 1.0 μm or more. The minimum thickness ($t_{401}$) of the organic layer 401 may refer to the vertical shortest distance from the driving element layers 200 and 300, for example, the source electrode 270 to the base portion of the first uneven pattern 401r. If the minimum thickness ($t_{401}$) of the organic layer 401 is less than 0.5 μm, the organic layer 401 may not sufficiently protect the thin film transistor 200 and the like and it is difficult to normally drive the display device 1. Thus, a degradation of display quality may occur.

While FIG. 2 illustrates a configuration in which the width ($W_{TH}$) of the through-hole (TH) of the organic layer 401 is less than the width ($W_r$) on the plane of the first uneven pattern 401r for convenience of explanation, the width ($W_{TH}$) of the through-hole (TH) may be greater than the width ($W_r$) of the first uneven pattern 401r. In an exemplary embodiment, the width ($W_{TH}$) of the through-hole (TH) may be about 5 times or more, about 6 times or more, or about 7 times or more of the width ($W_r$) of the first uneven pattern 401r. For example, the upper limit of the width ($W_r$) of the first uneven pattern 401r is about 2.5 μm, about 2.0 μm, about 1.9 μm, about 1.8 μm, about 1.7 μm, about 1.6 μm, or about 1.5 μm. When the width ($W_{TH}$) of the through-hole (TH) is five times or more of the width of the first uneven pattern 401r, the process can be simplified in the manufacturing method of the display device, and the it is possible to control the size of the first uneven pattern 401r, for example, the depth ($P_r$) so as to fall within the aforementioned range. In addition, the light scattered by the first uneven pattern 401r can be made to advance at an angle at which the light does not enter other pixels. The lower limit of the width ($W_r$) of the first uneven pattern 401r is not particularly limited, and may be, for example, about 0.05 μm.

A distance ($d_r$) between the adjacent first uneven patterns 401r within a pixel, for example, a distance ($d_r$) between the adjacent uneven patterns among the plurality of first uneven patterns 401r disposed in the second pixel (PX2) representing a second color, may be 0.5 times or more of the width ($W_r$) of the first uneven pattern 401r. For example, the distance ($d_r$) between the first uneven patterns 401r may be about 0.7 μm to about 2.5 μm, or about 1.0 μm to about 2.0 μm. When the distance ($d_r$) between the first uneven patterns 401r is 0.5 times or more of the width ($W_r$) of the first uneven pattern 401r, the process in a manufacturing method of a display device may be simplified, and it is possible to prevent the adjacent first uneven pattern 401r from being connected. Further, the first uneven pattern 401r causing the light scattering may be sufficiently formed to improve (e.g., increase) the utilization efficiency of light.

In some embodiments, a minimum distance ($L_p$) between the adjacent pixels, for example, the first uneven pattern 401r in the first pixel (PX1) and the first uneven pattern 401r in the second pixel (PX2) may have a set or predetermined relationship with the minimum distance ($d_0$) between the light-emitting element 501 and the color conversion patterns 810 and 830. For example, the minimum distance ($L_p$) between the first uneven pattern 401r in the first pixel (PX1) and the first uneven pattern 401r in the second pixel (PX2) may be about 1.5 times or more, about 1.6 times or more, or about 1.7 times or more of the minimum distance ($d_0$) between the light-emitting element 501 and the color conversion patterns 810 and 830. When the minimum distance ($L_p$) between the first uneven pattern 401r in the first pixel (PX1) and the first uneven pattern 401r in the second pixel (PX2) has the aforementioned relationship with the minimum distance ($d_0$) between the light-emitting element 501 and the color conversion patterns 810 and 830, the light scattered by the first uneven pattern 401r is made to advance in an oblique direction with a sufficient angle. Thus, it is possible to enhance the color conversion efficiency of the patterns 810 and 830 and prevent the light scattered by the first uneven pattern 401r from entering other pixels or reduce instances thereof, which may lead to improvements to the display quality of the display device 1.

The light-emitting element 501 may be disposed on the organic layer 401. In an exemplary embodiment, the light-emitting element 501 may be an organic light-emitting element, which includes a first electrode 511 and a second electrode 531 facing each other, and an organic light-emitting layer 551 interposed therebetween. As a non-limiting example, the light-emitting element 501 disposed in the first pixel (PX1) and the light-emitting element 501 disposed in the second pixel (PX2) may emit light of substantially the same color. The light-emitting element 501 may be a full-surface light-emitting element that emits light to the side of the second electrode 531, that is, the upper side FIG. 2 to provide light to the color conversion patterns 810 and 830.

The first electrode 511 may be disposed directly on the organic layer 401. The first electrode 511 may be electrically connected to the source electrode 270 through the through-hole (TH) of the organic layer 401. The first electrode 511 may be an anode electrode having a work function that is relatively larger than that of the second electrode 531. The first electrode 511 may be a transparent electrode, an opaque electrode, or a stacked structure of the transparent electrode and the opaque electrode. Examples of the material for forming the transparent electrode include indium tin oxide (ITO), indium zinc oxide (IZO), zinc oxide, indium oxide, and the like. Examples of the material forming the opaque electrode include lithium (Li), aluminum (Al), magnesium (Mg), silver (Ag), nickel (Ni), chromium (Cr), and/or the like. The first electrode 511 may be a pixel electrode, which is arranged for each pixel (PX1, PX2) and to which a driving signal independent of each other is applied.

The second electrode 531 may be disposed on the first electrode 511. The second electrode 531 may be a cathode electrode having a work function relatively smaller than that of the first electrode 511. The first electrode 511 and the second electrode 531 are spaced apart from each other with the organic light-emitting layer 551 interposed between them, and the first electrode 511 and the second electrode 531 may drive the light-emitting element 501. Like the first electrode 511, the second electrode 531 may be a transparent electrode, an opaque electrode, or a stacked structure of the transparent electrode and the opaque electrode. The second electrode 531 may be a common electrode disposed over a plurality of pixels (PX1, PX2) without distinction of the pixels (PX1, PX2).

In the exemplary embodiment, the upper surface and the lower surface of the first electrode 511 have partially uneven surfaces, and the upper surface and the lower surface of the second electrode 531 may have partially uneven surfaces. For example, the upper surface of the first electrode 511 may have a second uneven pattern 511r, and the upper surface of the second electrode 531 may have a third uneven pattern 531r. The second uneven pattern 511r of the first electrode 511 and the third uneven pattern 531r of the second electrode 531 are located substantially at the central part of a light-emitting region ($R_e$). The second uneven pattern 511r and the third uneven pattern 531r may be scattering patterns that partially scatter the transmitted light.

The second uneven pattern 511r and the third uneven pattern 531r may overlap the first uneven pattern 401r of the organic layer 401 in the third direction Z, respectively. Further, the second uneven pattern 511r has a shape and an arrangement corresponding to the first uneven pattern 401r, and the third uneven pattern 531r may have a shape and an arrangement corresponding to the second uneven pattern 511r. As one non-limiting example, the second uneven pattern 511r may be caused by the first uneven pattern 401r, and the third uneven pattern 531r may be caused by the second uneven pattern 511r.

For example, the second uneven pattern 511r of the first electrode 511 may be a dot-shaped pattern having a substantially circular shape on a plane. The second uneven pattern 511r may be a recess pattern depressed downward from the reference surface of the first electrode 511 (e.g., the flat upper surface of the first electrode 511).

The second uneven pattern 511r of the upper surface of the first electrode 511 may form an optical interface capable of causing the light scattering at the interface with the organic light-emitting layer 551. Further, the uneven surface of the lower surface of the first electrode 511 may form an optical interface that is in contact with the first uneven pattern 401r of the organic layer 401 and may cause the light scattering at the interface with the organic layer 401.

Similarly, the third uneven pattern 531r of the second electrode 531 may be a dot-shaped pattern having a substantially circular shape on the plane. The third uneven pattern 531r may be a recess pattern depressed downward from the reference surface of the second electrode 531 (e.g., the flat upper surface of the second electrode 531). The depth of the third uneven pattern 531r may be smaller than the depth of the second uneven pattern 511r.

The third uneven pattern 531r of the upper surface of the second electrode 531 may form an optical interface capable of causing the light scattering at the interface with a first inorganic encapsulation layer 710. In addition, the uneven surface of the lower surface of the second electrode 531 may form an optical interface capable of causing the light scattering at the interface with the organic light-emitting layer 551.

The arrangement of the first uneven pattern 401r, the second uneven pattern 511r, and the third uneven pattern 531r will be described further below.

The organic light-emitting layer 551 may be interposed between the first electrode 511 and the second electrode 531. The organic light-emitting layer 551 may be a stacked structure made up of one or more layers or regions including the light-emitting layers 551a and 551b. The light-emitting layers 551a and 551b may recombine holes and electrons transmitted from the first electrode 511 and the second electrode 531 to generate light. For example, the holes and electrons are recombined in the light-emitting layers 551a and 551b to form excitons, and the excitons change from the excited state to the base state and may emit light. The light-emitting layers 551a and 551b performs fluorescence or phosphorescence emission of blue light having a peak wavelength in the range of about 420 nm to about 490 nm, and the light-emitting element 501 may be a blue light-emitting element.

The organic light-emitting layer 551 may have a shape that is bent by the second uneven pattern 511r of the first electrode 511. That is, the organic light-emitting layer 551 may be bent along the surface of the second uneven pattern 511r. In this case, the thickness of the organic light-emitting layer 551 may be substantially uniform, despite the level difference formed by the first uneven pattern 401r and the second uneven pattern 511r. Accordingly, the intended resonance distance of the organic light-emitting layer 551 may be satisfied.

In an exemplary embodiment, the organic light-emitting layer 551 includes a first light-emitting layer 551a and a second light-emitting layer 551b, and includes charge generation regions 551c and 551d, hole controlling regions 551e and 551h, and electron controlling regions 551f and 551g.

The first light-emitting layer 551a may be disposed between the first electrode 511 and the second electrode 531. The first light-emitting layer 551a may emit light of a blue wavelength band having a peak wavelength in the range of about 420 nm to about 490 nm. Further, the second light-emitting layer 551b may be disposed between the first light-emitting layer 551a and the second electrode 531. Like the first light-emitting layer 551a, the second light-emitting layer 551b may emit light of a blue wavelength band having a peak wavelength in the range of about 420 nm to about 490 nm. In some embodiments, the peak wavelength of the blue wavelength band light emitted from the first light-emitting layer 551a may be different from the peak wavelength of the blue wavelength band light emitted from the second light-emitting layer 551b. For example, the first light-emitting layer 551a and the second light-emitting layer 551b contain phosphorescent or fluorescent materials different from each other, or the resonance distance of the light emitted from the first light-emitting layer 551a may be different from the resonance distance of light emitted from the second light-emitting layer 551b.

By disposing the first light-emitting layer 551a and the second light-emitting layer 551b emitting light of the blue wavelength band having a peak wavelength in the range of about 420 nm to 490 nm to overlap within one pixel in the third direction Z, the intensity of the light emitted from the light-emitting element 501 may be improved (e.g., increased). Further, although both the first light-emitting layer 551a and the second light-emitting layer 551b contribute to the generation of light emitted from the light-emitting element 501, by setting the peak wavelength of light emitted from the first light-emitting layer 551a and the second light-emitting layer 551b to be different from each other, it is possible to easily control the color coordinates of the light emitted from the light-emitting element 501 and to improve the display quality of the display device 1. The first light-emitting layer 551a and the second light-emitting layer 551b may be disposed over the first pixel (PX1) and the second pixel (PX2) without distinction between the pixels PX1 and PX2; however, the present invention is not limited thereto.

The charge generation regions 551c and 551d may be disposed between the first light-emitting layer 551a and the second light-emitting layer 551b. The charge generation regions 551c and 551d generate charges and may adjust the charge balance between the first light-emitting layer 551a and the second light-emitting layer 551b. By disposing the charge generation regions 551c and 551d between the first light-emitting layer 551a and the second light-emitting layer 551b, it is possible to improve the light-emitting efficiency of the light-emitting element 501 and to lower the drive voltage.

For example, the charge generation regions 551c and 551d may include an n-type charge generation region 551c and a p-type charge generation region 551d. The p-type charge generation region 551*d* may be disposed between the n-type charge generation region 551*c* and the second light-emitting layer 551*b*. The n-type charge generation region 551*c* may contribute to provision of electrons to the side of the first light-emitting layer 551*a*. Further, the p-type charge generation region 551*d* may contribute to the provision of holes to the side of the second light-emitting layer 551*b*. In some embodiments, a buffer region may be further interposed between the n-type charge generation region 551*c* and the p-type charge generation region 551*d*.

The first hole control region 551*e* may be disposed between the first electrode 511 and the first light-emitting layer 551*a*. The first hole control region 551*e* may include one or more of a hole injection region and a hole transport region. For example, the first hole control region 551*e* may have a stacked structure of the hole injection region and the hole transport region. The thickness of the first hole control region 551*e* may be about 100 Å to about 10,000 Å, or about 100 Å to about 1,000 Å; however, the present invention is not limited thereto.

Further, the first electronic control region 551*f* may be disposed between the first light-emitting layer 551*a* and the charge generation regions 551*c* and 551*d*. The first electronic control region 551*f* may include one or more of the electron injection region and the electron transport region. The thickness of the first electronic control region 551*f* may be about 100 Å to about 10,000 Å, or about 100 Å to about 1,000 Å; however, the present invention is not limited thereto.

The second electronic control region 551*g* may be disposed between the second electrode 531 and the second light-emitting layer 551*b*. The second electronic control region 551*g* may include one or more of the electron injection region and the electron transport region. In addition, the second hole control region 551*h* may be disposed between the second light-emitting layer 551*b* and the charge generation regions 551*c* and 551*d*. The second hole control region 551*h* may include one or more of the hole control region and the hole transport region. The charge generation regions 551*c* and 551*d*, the hole control regions 551*e* and 551*h*, and the electronic control regions 551*f* and 551*g* described above may be disposed over all the first pixel (PX1) and the second pixel (PX2). However, the present invention is not limited thereto.

On the other hand, the pixel defining layer 600 may be disposed on the organic layer 401 and the first electrode 511. The pixel defining layer 600 may serve to distinguish a plurality of pixels (PX1 and PX2). The pixel defining layer 600 may be disposed to have an opening that partially exposes the surface of the first electrode 511. That is, from a plan view, the pixel defining layer 600 may have an opening that exposes the first electrode 511 disposed for each pixel. The organic light-emitting layer 551 and the second electrode 531 described above may be disposed on the pixel defining layer 600. The pixel defining layer 600 may include an organic material such as an acrylic resin or an imide resin. In some embodiments, the pixel defining layer 600 may also have set or predetermined light shielding properties. The pixel defining layer 600 may partially overlap the first color conversion pattern 830 and the second color conversion pattern 810 in the third direction Z.

The pixel defining layer 600 defines a light-emitting region ($R_e$) and a non-light-emitting region ($R_{ne}$) of the display device 1. For example, the opening region of the pixel defining layer 600 may define the light-emitting region (Re). The light-emitting region (Re) is a region in which light is emitted from the light-emitting element 501 to contribute to the image display of the display device 1. Further, the non-light-emitting region ($R_{ne}$) is a region that is located between the adjacent light-emitting regions ($R_e$) and does not emit light. In other words, the portion that does not overlap the pixel defining layer 600 and is not covered with the pixel defining layer 600 to expose the first electrode 511 is a light-emitting region ($R_e$), and a region overlapping the pixel defining layer 600 may be a non-light-emitting region ($R_{ne}$). From a plan view, the light-emitting region ($R_e$) may be arranged in a matrix form, and the non-light-emitting region ($R_{ne}$) may have a lattice shape.

Hereinafter, the arrangement of the first uneven pattern 401*r*, the second uneven pattern 511*r*, and the third uneven pattern 531*r* will be described in detail.

A pattern region ($R_p$) and a non-pattern region ($R_{np}$), in which one or more among the first uneven pattern 401*r*, the second uneven pattern 511*r*, and the third uneven pattern 531*r* are located, may be defined on the display device 1. Hereinafter, the pattern region ($R_p$) and the non-pattern region ($R_{np}$) of the organic layer 401 will be described with reference to the first uneven pattern 401*r* of the organic layer 401, and the second uneven pattern 511*r* of the first electrode 511 and the third uneven pattern 531*r* of the second electrode 531 may also be understood in the same manner.

In an exemplary embodiment, the organic layer 401 may have a pattern region ($R_p$) in which the first uneven pattern 401*r* is formed, and a non-pattern region ($R_{np}$) having a substantially flat surface. The non-pattern region ($R_{np}$) of the organic layer 401 may be in partial contact with the first electrode 511 and the pixel defining layer 600. From a plan view, the non-pattern region ($R_{np}$) of the organic layer 401 surrounds the pattern region ($R_p$) and may have a substantially flat surface without forming an uneven surface.

The pattern region ($R_p$) of the organic layer 401 may be located in the light-emitting region (Re). For example, the first uneven pattern 401*r* of the organic layer 401 may be located substantially at the central part of the opening from which the pixel defining layer 600 is exposed. As a non-limiting example, the pattern region ($R_p$) in which the first uneven pattern 401*r* of the organic layer 401 is located may not completely overlap the pixel defining layer 600. The light emitted from the organic light-emitting layer 551 and advancing through the pattern region ($R_p$) may contain relatively much scattered light components. Accordingly, the pattern region ($R_p$) may contribute to an enhancement in the color conversion efficiency by the color conversion patterns 810 and 830 and an improvement in the brightness of the display device 1. This will be described further in connection with FIG. 5.

Further, the non-pattern region ($R_{np}$) of the organic layer 401 may be partially located in the light-emitting region ($R_e$), and the non-pattern region ($R_{np}$) may be partially located in the non-light-emitting region ($R_{ne}$). In other words, at least a part of the non-pattern region ($R_{np}$) of the organic layer 401 may be located between the pattern region ($R_p$) of the organic layer 401 and the pixel defining layer 600. The non-pattern region ($R_{np}$) secures a region for separating the pattern region ($R_p$) from the pixel defining layer 600, and may contribute to prevention of color mixing defect of the display device 1. This will be described further in connection with FIG. 5.

As described above, the light-emitting region ($R_e$) may be a region including at least a part of the pattern region ($R_p$) and the non-pattern region ($R_{np}$). That is, all the pattern region (Rp) in which the first uneven pattern 401*r* of the organic layer 401 is formed, and the non-pattern region ($R_{np}$) surrounding the pattern region ($R_p$) with the flat surface may be at least partially located in the light-emitting region ($R_e$). In other words, the light emitted by the organic light-emitting layer 551 may be emitted through the pattern region ($R_p$) and the non-pattern region ($R_{np}$), and the light emitted through the pattern region ($R_p$) and the non-pattern region ($R_{np}$) may contribute to the image display of the display device 1. Therefore, the color conversion patterns 810 and 830 overlap the pattern region ($R_p$), and may be disposed to overlap at least a part of the non-pattern region ($R_{np}$).

In an exemplary embodiment, the side surface of the pixel defining layer 600 and the first uneven pattern 401r may be separated from each other. A minimum horizontal spaced distance ($L_r$) between the side surface of the pixel defining layer 600 and the first uneven pattern 401r closest therefrom may have a set or predetermined relation with a predetermined spaced distance ($d_0$) between the light-emitting element 501 and the color conversion patterns 810 and 830. For example, the minimum horizontal distance ($L_r$) between the side surface of the pixel defining layer 600 and the first uneven pattern 401r may be about 0.5 times or more of the minimum distance ($d_0$) between the light-emitting element 501 and the color conversion patterns 810 and 830. When the minimum horizontal distance ($L_r$) between the side surface of the pixel defining layer 600 and the first uneven pattern 401r has the aforementioned relationship with the minimum distance ($d_0$) between the light-emitting element 501 and the color conversion patterns 810 and 830, the light scattered by the first uneven pattern 401r is made to advance in an oblique direction with a sufficient angle to enhance the color conversion efficiency by the color conversion patterns 810 and 830, the light scattered by the first uneven pattern 401r can be prevented from entering other pixels or instances thereof may be reduced, and the display quality of the display device 1 can thus be improved.

In some embodiments, the minimum horizontal distance ($L_r$) between the side surface of the pixel defining layer 600 and the first uneven pattern 401r may be about 10% or more of the width of the light-emitting region ($R_e$). As a non-limiting example, the minimum horizontal distance ($L_r$) between the side surface of the pixel defining layer 600 and the first uneven pattern 401r may be about 5.0 μm or more, about 6.0 μm or more, about 7.0 μm or more, about 8.0 μm or more, about 9.0 μm or more, or about 10.0 μm or more.

Although the pattern region ($R_p$) and the non-pattern region ($R_{np}$) have been described using the first uneven pattern 401r of the organic layer 401, the second uneven pattern 511r of the first electrode 511 and the third uneven pattern 531r of the second electrode 531 may be similarly understood.

For example, the first electrode 511 may include a pattern region ($R_p$) in which the second uneven pattern 511r is formed, and a non-pattern region ($R_{np}$) having a flat surface. The pattern region ($R_p$) of the first electrode 511 may be located in the light-emitting region ($R_e$). Further, the non-pattern region ($R_{np}$) of the first electrode 511 may be partially located in the light-emitting region ($R_e$) and may be partially located in the non-light-emitting region ($R_{ne}$). The side surface of the pixel defining layer 600 and the second uneven pattern 511r are spaced apart from each other, and the minimum horizontal distance may be about 0.5 times or more of the minimum distance ($d_0$) between the light-emitting element 501 and the color conversion patterns 810 and 830. The non-pattern region ($R_{np}$) of the first electrode 511 may be located between the pattern region ($R_p$) and the pixel defining layer 600. In some embodiments, the minimum horizontal distance between the side surface of the pixel defining layer 600 and the second uneven pattern 511r may be about 10% or more of the width of the light-emitting region ($R_e$). As a non-limiting example, the minimum horizontal distance between the side surface of the pixel defining layer 600 and the second uneven pattern 511r may be about 5.0 μm or more, about 6.0 μm or more, about 7.0 μm or more, about 8.0 μm or more, about 9.0 μm or more, or about 10.0 μm or more.

In an exemplary embodiment, the arrangement density of the second uneven pattern 511r of the first electrode 511 may be partially different. For example, the array density of the second uneven pattern 511r at the central part of the first electrode 511 may be greater than the arrangement density of the second uneven pattern 511r at the edge part of the first electrode 511. For example, the second uneven pattern 511r of the first electrode 511 may be located only at the central part of the first electrode 511, and may not be located at the edge part of the first electrode 511.

Further, the second electrode 531 may include a pattern region ($R_p$) in which the third uneven pattern 531r is formed, and a non-pattern region ($R_{np}$) having a flat surface. The pattern region ($R_p$) of the second electrode 531 may be located in the light-emitting region ($R_e$). Further, the non-pattern region ($R_{np}$) of the second electrode 531 may be partially located in the light-emitting region ($R_e$) and may be partially located in the non-light-emitting region ($R_{ne}$). The side surface of the pixel defining layer 600 and the third uneven pattern 531r are spaced apart from each other, and the minimum horizontal distance may be about 0.5 times or more of the minimum distance ($d_0$) between light-emitting element 501 and the color conversion patterns 810 and 830. The non-pattern region ($R_{np}$) of the second electrode 531 may be located between the pattern region ($R_p$) and the pixel defining layer 600. In some embodiments, the minimum horizontal distance between the side surface of the pixel defining layer 600 and the third uneven pattern 531r may be about 10% or more of the width of the light-emitting region ($R_e$). As a non-limiting example, the minimum horizontal distance between the side surface of the pixel defining layer 600 and the third uneven pattern 531r may be about 5.0 μm or more, about 6.0 μm or more, about 7.0 μm or more, about 8.0 μm or more, about 9.0 μm or more, or about 10.0 μm or more.

On the other hand, an encapsulation layer 700 may be disposed on the light-emitting element 501. The encapsulation layer 700 may prevent impurities, such as moisture and air, from entering from the outside of the display device 1 and damaging or denaturalizing the light-emitting element 501. The encapsulation layer 700 may be disposed to seal or encapsulate the light-emitting element 501.

The encapsulation layer 700 may be a thin-film sealing film including one or more inorganic encapsulation layers 710 and 750, and one or more organic encapsulation layers 730. For example, the encapsulation layer 700 may include the organic encapsulation layer 730 and the inorganic encapsulation layers 710 and 750 alternately stacked on one another. In an exemplary embodiment, the encapsulation layer 700 may include a first inorganic encapsulation layer 710 disposed on the second electrode 531 and made of an inorganic material, an organic encapsulation layer 730 disposed on the first inorganic encapsulation layer 710 and made of an organic material, and a second inorganic encapsulation layer 750 disposed on the organic encapsulation layer 730 and made of an inorganic material. Examples of the inorganic material include silicon oxide, silicon nitride, silicon nitride oxide, silicon oxynitride, titanium oxide, aluminum oxide, and/or the like. Examples of the organic material include an acrylic resin, an epoxy resin, or the like.

FIG. 2 and the like illustrate a case where the encapsulation layer 700 has a stacked structure of three organic layers and inorganic layers, and the encapsulation layer 700 may have a stacked structure of the two layers or a stacked structure of the four layers or more. In some embodiments, the encapsulation layer 700 may also include a siloxane-based encapsulation layer such as hexamethyldisiloxane and/or the like.

As a non-limiting example, an uppermost layer of the encapsulation layer 700 may be made of an inorganic material. Further, a lowermost layer that is in contact with the second electrode 531 of the encapsulation layer 700 may be made of an inorganic material. In this case, the lowermost layer, for example, the first inorganic encapsulation layer 710 may have an uneven surface corresponding to the third uneven pattern 531r of the second electrode 531.

A light shielding member 135 may be disposed on the encapsulation layer 700. The light shielding member 135 may be disposed at the boundary between the adjacent pixels (PX1 and PX2) to shield the transmission of light. For example, the light shielding member 135 is disposed in a roughly lattice form on the plane, and may prevent light from entering the adjacent pixels and causing a color mixing defect.

A counter substrate 130 may be disposed on the light shielding member 135. The counter substrate 130 may be a transparent substrate. In some embodiments, the counter substrate 130 may also be flexible. For example, the counter substrate 130 may be made of a glass material, a quartz material or the like, or may be made of a flexible polymer material such as polyimide, polycarbonate, polyethylene terephthalate, and polyacrylate, and/or the like.

The color conversion patterns 810 and 830 may be disposed on one surface (e.g., the lower surface of FIG. 2) of the counter substrate 130. The color conversion patterns 810 and 830 may include a first color conversion pattern 830 arranged in the first pixel (PX1), and a second color conversion pattern 810 arranged in the second pixel (PX2). Each of the first color conversion pattern 830 and the second color conversion pattern 810 block transmission of light in a specific wavelength band, selectively transmit only light in a specific wavelength band, and may convert the wavelength spectrum of the transmitted light differently from the wavelength spectrum of the incident light.

In an exemplary embodiment, the first color conversion pattern 830 may be a color filer that includes a first base resin 831, and a colorant, such as a pigment or dye, dispersed or dissolved in the first base resin 831. In some embodiments, the first color conversion pattern 830 may further include a first scatterer 833 dispersed within the first base resin 831.

The first base resin 831 is not particularly limited as long as it has excellent dissolution/dispersion characteristics of the colorant and the first scatterer 833 and has a light-transmitting property, the first base resin 831 may include, for example, acrylic resin, imide resin, epoxy resin and/or the like.

The colorant may be dispersed or dissolved in the first base resin 831 and may selectively absorb at least a part of the wavelength band of the light transmitting through the first color conversion pattern 830. For example, the first color conversion pattern 830 selectively transmits the blue peak wavelength, and partially absorbs the wavelength band near the blue peak wavelength, so that the blue spectrum displayed by the first pixel (PX1) can be made sharper, which makes it possible to have an effect of improving color purity. In particular, when the organic light-emitting layer 551 of the light-emitting element 501 includes a first light-emitting layer 551a and a second light-emitting layer 551b that emit blue light having different peak wavelengths, it is possible to easily correct the color coordinate, by disposing the first color conversion pattern 830 that absorbs the wavelength band near the blue peak wavelength, and the wavelength band of green/red.

The first scatterer 833 may be particles having a refractive index different from the first base resin 831, for example, light scattering particles. Although the first scatterer 833 is not particularly limited as long as it is a material that forms an optical interface with the first base resin 831 and can partially scatter the transmitted light, the first scatterer 833 may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and/or the like. Examples of the organic material may include acrylic resins or urethane resins. The first scatterer 833 can scatter light in several directions irrespective of the incident angle, without substantially converting the wavelength of the light transmitted through the first color conversion pattern 830. Therefore, it is possible to improve the side visibility of the first color displayed by the first pixel (PX1) of the display device 1.

In an exemplary embodiment, the second color conversion pattern 810 may be a wavelength shift pattern, which includes a second base resin 811 and a wavelength shift material 812 dispersed in the second base resin 811, and further includes a second scatterer 813 dispersed in the second base resin 811. For example, the second color conversion pattern 810 absorbs the blue light provided from the light-emitting element 501 and may convert it into light of a wavelength band having a peak wavelength of a second color (e.g., red or green).

The wavelength shift material 812 may emit light having a peak wavelength of the second color after absorbing the blue light emitted by the light-emitting element 501. As a result, the second pixel (PX2) may display the second color. Examples of the wavelength shift material 812 may include quantum dots, quantum rods or phosphors. For example, the quantum dot material may emit a specific color, while electrons are transferred from a conduction band to a valence band.

The quantum dots may be semiconductor nanocrystalline materials. The quantum dots have a specific band gap depending on their composition and size, and may emit light having an inherent band after absorbing light. Examples of the semiconductor nanocrystals of the quantum dots may include a Group IV based nanocrystal, a Group II-VI based compound nanocrystal, a Group III-V based compound nanocrystal, a Group IV-VI based nanocrystal, or a combination thereof.

For example, the group IV based nanocrystal may include a dyadic compound such as silicon (Si), germanium (Ge), silicon carbide (SiC), and silicon-germanium (SiGe); however, the present invention is not limited thereto.

Further, the group II-VI compound nanocrystals may include dyadic compounds, such as CdSe, CdTe, ZnS, ZnSe, ZnTe, ZnO, HgS, HgSe, HgTe, MgSe, MgS, mixtures thereof, and/or the like; triad compounds, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, mixtures thereof, and/or the like; and tetrad compounds, such as HgZnTeS, CdZnSeS, CdZnSeTe, CdZnSTe, CdHgSeS, CdHgSeTe, CdHgSTe, HgZnSeS, HgZnSeTe, HgZnSTe, mixtures thereof, and/or the like; however, the present invention is not limited thereto.

In addition, the group III-V compound nanocrystals may include dyadic compounds, such as GaN, GaP, GaAs, GaSb, AlN, AlP, AlAs, AlSb, InN, InP, InAs, InSb, mixtures thereof, and/or the like; triad compounds, such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, mixtures thereof, and/or the like; or tetrad compounds, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, mixtures thereof, and/or the like. However, the present invention is not limited thereto.

The group IV-VI nanocrystals may include dyadic compounds, such as SnS, SnSe, SnTe, PbS, PbSe, PbTe, mixtures thereof, and/or the like; triad compounds, such as SnSeS, SnSeTe, SnSTe, PbSeS, PbSeTe, PbSTe, SnPbS, SnPbSe, SnPbTe, mixtures thereof, and/or the like; or tetrad compounds, such as SnPbSSe, SnPbSeTe, SnPbSTe, mixtures thereof, and/or the like. However, the present invention is not limited thereto.

The form of the quantum dots is not particularly limited, and it is possible to adopt, for example, spherical, pyramidal, multi-arm type or cubic type nanoparticles, a nanotube, a nanowire, a nano fiber, a nanoplate-like particle and the like. As mentioned above, the dyadic compounds, the triad compounds, or the tetrad compounds may be present in the particle at a uniform concentration, or may be present in the same particle by being divided into a state in which the concentration distribution is partially different.

In some embodiments, the quantum dots may also have a core-shell structure, which includes a core including the aforementioned nanocrystals and a shell surrounding the core.

The shell of the quantum dots may serve as a protective layer for preventing or reducing the chemical denaturation of the core to maintain semiconductor characteristics and/or a charging layer for imparting electrophoretic characteristics to the quantum dots. The shell may be a single layer or a multi-layer structure. As an example, a metal or non-metal oxide, a semiconductor compound, a combination thereof, and/or the like may be adopted as the shell of the quantum dots.

For example, the above-mentioned metal or nonmetal oxide may include a dyadic compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; or triad compounds, such as $MgAl_2O_4$, $CoFe_2O_4$, $NiFe_2O_4$, $CoMn_2O_4$, and/or the like; however, the present invention is not limited thereto.

Further, the above-mentioned semiconductor compound may include CdS, CdSe, CdTe, ZnS, ZnSe, ZnTe, GaAs, GaP, GaSb, HgS, HgSe, HgTe, InAs, InP, InSb, AlAs, AlP, AlSb, and/or the like; however, the present invention is not limited thereto.

The light emitted by the wavelength shift material 812 may have a half width of the light-emitting wavelength spectrum of about 45 nm or less, about 40 nm or less, or about 30 nm or less, thereby further improving the color purity and the color reproducibility. Further, the light emitted by the wavelength shift material 812 may be emitted in various directions regardless of the incident angle of the incident light. Therefore, it is possible to improve the side visibility of the second color displayed by the second pixel (PX2) of the display device 1.

The lower limit of the thickness of the second color conversion pattern 810 in the third direction Z may be about 5.0 µm, about 6.0 µm, or about 7.0 µm. It is possible to improve the color conversion efficiency of light passing through the second color conversion pattern 810 by forming the second color conversion pattern 810 to have a sufficient thickness. The upper limit of the thickness of the second color conversion pattern 810 is not particularly limited, and the thickness may be about 20.0 µm or about 15.0 µm.

The second scatterer 813 may be light scattering particles. As with the first scatterer 833, the second scatterer 813 is not particularly limited as long as a material is capable of forming an optical interface with the second base resin 811 to partially scatter the transmitted light. For example, metal oxide particles or organic particles may be used. The second scatterer 813 may scatter at least a part of the light transmitting through the second color conversion pattern 810. As a result, the length of the path of the light transmitting through the second color conversion pattern 810 can be increased, and the color conversion efficiency of the wavelength shift material 812 can be further increased.

In another embodiment, the second color conversion pattern 810 may also be a color filter including colorant, such as dye or pigment, dispersed in the second base resin 811.

The first color conversion pattern 830 and the second color conversion pattern 810 may have a shape that is gradually tapered from the side of the counter substrate 130 toward the side of the light-emitting element 501, that is, gradually tapered toward the lower side in FIG. 2. Further, the first color conversion pattern 830 and the second color conversion pattern 810 may be spaced apart from each other. For example, the inclined side surface of the first color conversion pattern 830 and the inclined side surface of the second color conversion pattern 810 may be spaced apart from each other. By physically separating the first color conversion pattern 830 and the second color conversion pattern 810 from each other, it is possible to prevent the light scattered in the first color conversion pattern 830 from advancing toward the second color conversion pattern 810 side, or to prevent the light emitted by the wavelength shift material 812 of the second color conversion pattern 810 from advancing toward the first color conversion pattern 830 side, or reduce instances thereof.

In some embodiments, a wavelength band filter 850 may be disposed in the second pixel (PX2). The wavelength band filter 850 may be disposed between the second color conversion pattern 810 and the counter substrate 130. The wavelength band filter 850 may be a wavelength selective optical filter that shields transmission of a specific wavelength band of incident light and selectively transmits only light of another specific wavelength band. For example, the wavelength band filter 850 may be a color filter or a distributed Bragg reflector.

The wavelength band filter 850 may selectively transmit the light having the second color, for example, the light having the red color or the green color, after passing through the second color conversion pattern 810, and may shield transmission of the first color light, that is, the blue light emitted by the light-emitting element 501. The wavelength band filter 850 may absorb or reflect the blue light directly transmitted without being color-converted by the second color conversion pattern 810 among the blue light provided from the light-emitting element 501. As a result, the purity of the second color expressed by the second pixel (PX2) can be further improved.

In another embodiment, a low refractive layer may be further interposed between the second color conversion pattern 810 and the wavelength band filter 850. The low refractive layer includes an organic material or an inorganic material, and may have a lower refractive index than the second color conversion pattern 810 and/or the wavelength band filter 850. For example, the refractive index of the low refractive layer may be about 1.3 or less, and the difference between the refractive index of the low refractive layer and the refractive index of the second base resin 811 of the second color conversion pattern 810 may be about 0.1 or more, about 0.2 or more, or about 0.3 or more. Although the present invention is not limited thereto, by setting the difference in refractive index between the second color conversion pattern 810 and the low refractive layer to be relatively large, it is possible to reduce a critical angle of the light advancing from the second color conversion pattern 810 side toward the low refraction layer side for being totally reflected at the interface between the second color conversion pattern 810 and the low refraction layer, and the total reflection of the light can be easily induced. By partially or totally reflecting the light passing through the second color conversion pattern 810, at least a part of the light can be recycled, and the utilization efficiency of light can be improved.

A barrier layer 870 may be disposed on the first color conversion pattern 830 and the second color conversion pattern 810. The barrier layer 870 may be disposed at a substantially uniform thickness along the surfaces of the first color conversion pattern 830 and the second color conversion pattern 810. The barrier layer 870 may prevent or limit impurities, such as moisture and air, from entering from the outside to damage or denaturize the wavelength shift material 812 or the like. The barrier layer 870 may be made of an inorganic material such as nitrogen oxide, silicon oxide, silicon nitride oxide, silicon oxynitride, and/or the like.

An adhesive layer 900 may be disposed between the encapsulation layer 700 and the barrier layer 870. The adhesive layer 900 may be disposed between the encapsulation layer 700 and the barrier layer 870 to fill the spaced space and combine them. For example, the adhesive layer 900 may be in contact with the barrier layer 870 and the second inorganic encapsulation layer 750.

Figure 5:
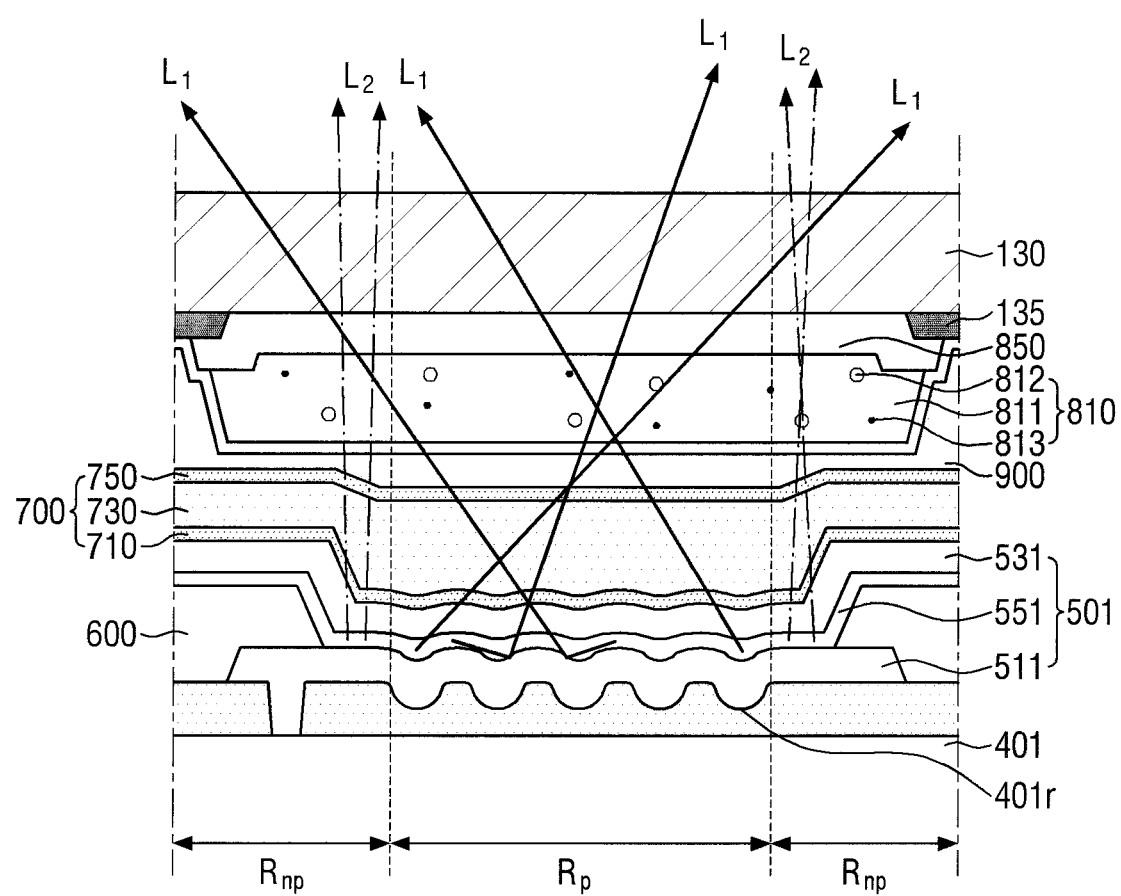
FIG. 5 is a cross-sectional view illustrating paths of light emitted from the light-emitting element of the display device of FIG. 2.

Hereinafter, a process of achieving the color display by the display device 1 according to the present embodiment will be described in detail with reference to FIG. 5. FIG. 5 is a cross-sectional view illustrating paths of light emitted from the light-emitting element of the display device of FIG. 2.

Referring to FIGS. 1 to 5, the first light-emitting layer 551a and the second light-emitting layer 551b of the light-emitting element 501 may emit light of the blue wavelength band. In the exemplary embodiment, it is possible to provide a resonance structure in which the lights ($L_1$, $L_2$) emitted by the organic light-emitting layer 551 of the light-emitting element 501 is reflected at least once at the interface between the organic layer 401 and the first electrode 511, the interface between the first electrode 511 and the organic light-emitting layer 551, the interface between the organic light-emitting layer 551 and the second electrode 531, or the interface between the second electrode 531 and the first inorganic encapsulation layer 710.

In this case, among the lights ($L_1$, $L_2$) emitted by the organic light-emitting layer 551, the light ($L_1$) advancing through the pattern region ($R_p$) in which the first uneven pattern 401r, the second uneven pattern 511r and/or the third uneven pattern 531r are located may be at least partially scattered. That is, the light ($L_1$) advancing through the pattern region ($R_p$) may contain a lot of relatively scattered light components.

The scattered light ($L_1$) may advance in a set or predetermined oblique direction. For example, the scattered light ($L_1$) may advance with an inclination angle of about 10 degrees to 60 degrees, about 20 degrees to about 60 degrees, or about 30 degrees to 60 degrees with respect to the normal of the plane on which the first direction X and the second direction Y reside, and may be incident on the second color conversion pattern 810 side to contribute to the image display and the color display. As the light ($L_1$) emitted through the pattern region ($R_p$) travels in the oblique direction, the length of the path of the light that passes through the second color conversion pattern 810 may relatively increase, as compared with the case where the light travels in the vertical direction. Accordingly, the color conversion efficiency by the wavelength shift material 812 can be further improved. Further, it is possible to suppress the scattered light ($L_1$) from entering the adjacent pixel, by setting the size of the first uneven pattern 401r and/or the array of the first uneven pattern 401r or the like within the above-mentioned range.

On the other hand, among the light ($L_1$, $L_2$) emitted by the organic light-emitting layer, the light ($L_2$) advancing through the non-pattern region ($R_{np}$) in which the first uneven pattern 401r, the second uneven pattern 511r, and the third uneven pattern 531r are not located may advance in an approximately vertical direction. That is, the light ($L_2$) advancing through the non-pattern region ($R_{np}$) may contain relatively much straight light component. The light ($L_2$) emitted in the approximately vertical direction directly enters the second color conversion pattern 810 side without entering the adjacent pixels, and can contribute to the image display and the color display. That is, in terms of prevention of color mixing, it may be desirable to sufficiently secure the non-pattern region ($R_{np}$).

In the display device 1 according to this embodiment, characteristics of light emitted through the light-emitting region ($R_e$) in any pixel (PX1, PX2) including the pattern region ($R_p$) and the non-pattern region ($R_{np}$), for example, the advancing directions of light may be partially different. Therefore, it is possible to improve the color conversion efficiency by the color conversion patterns 810, 820, while preventing or limiting color mixing defects.

Although FIG. 5 is described on the basis of the optical path in the second pixel (PX2), the optical path in the first pixel (PX1) may also be understood in the same way.

Hereinafter, other embodiments of the present invention will be described. However, description of configurations that are substantially the same as the display device according to the embodiment of FIG. 1 and the like, explained above, may not be repeated, as they will be clearly understood by ordinary technicians belonging to the technical field, from the attached drawings.

Figure 6:
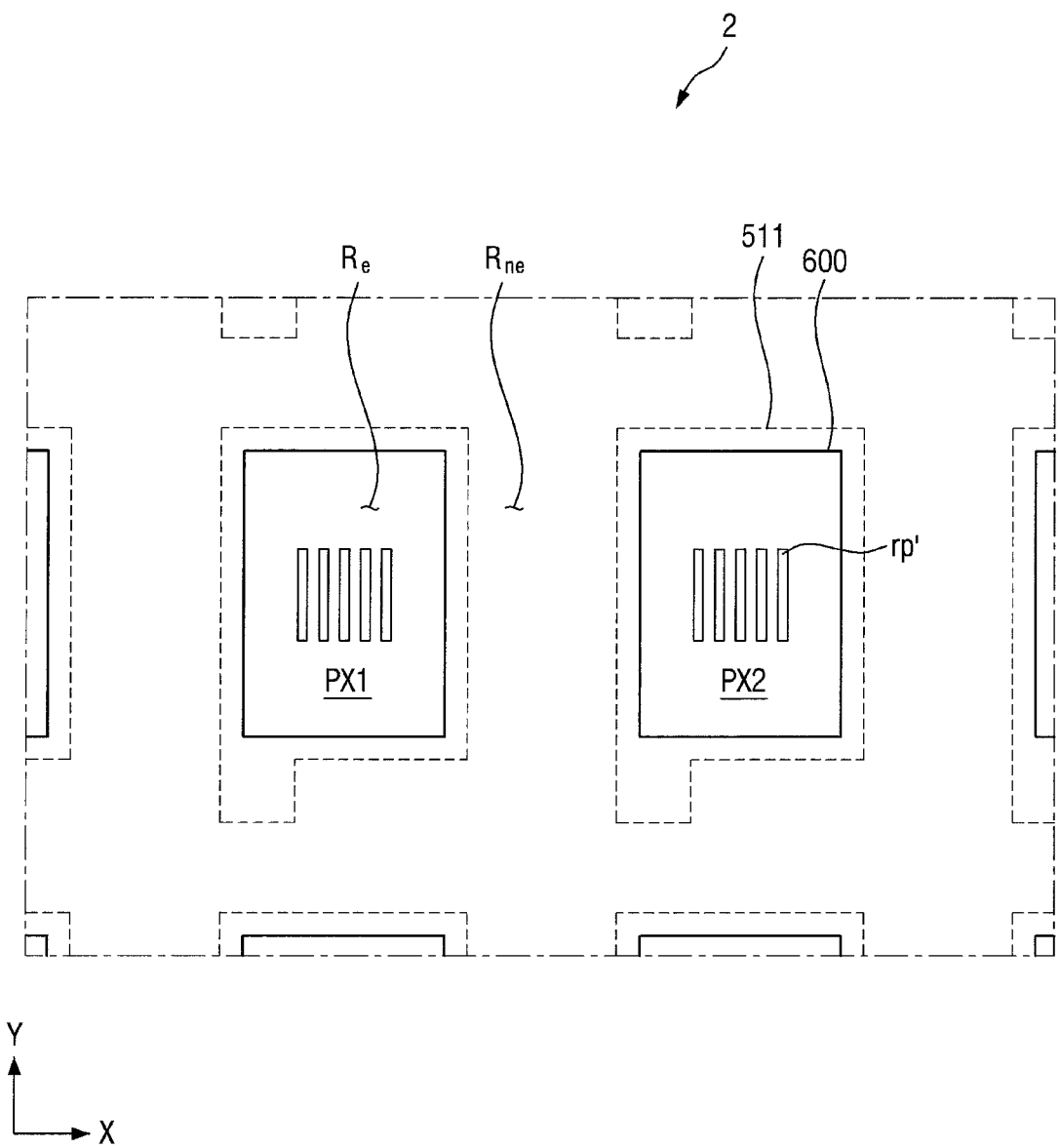
FIG. 6 is a layout view of arbitrary pixels of a display device according to another embodiment of the present invention.

FIG. 6 is a layout view of an arbitrary pixel of a display device according to another embodiment of the present invention.

Referring to FIG. 6, the display device 2 according to this embodiment differs from the display device 1 according to the embodiment of FIG. 1 and the like in that a linear uneven pattern (rp') is included on the plane. The uneven pattern (rp') may include an uneven pattern on the upper surface of the organic layer, an uneven pattern on the upper surface of the first electrode and/or an uneven pattern on the upper surface of the second electrode.

In the exemplary embodiment, the uneven patterns (rp') may be formed at the substantially central parts of each pixel (PX1, PX2), for example, at the approximately central parts of the light-emitting region ($R_e$) of each pixel (PX1, PX2). The uneven patterns (rp') may extend in the second direction Y on the plane and may be spaced part from each other in the first direction X. However, the present invention is not limited thereto. In other embodiments, the uneven patterns (rp') may extend in the first direction X on the plane and may be spaced apart from each other in the second direction Y. The uneven patterns (rp') may be recess patterns depressed from the reference surface or convex patterns projecting from the reference surface.

Figure 7:
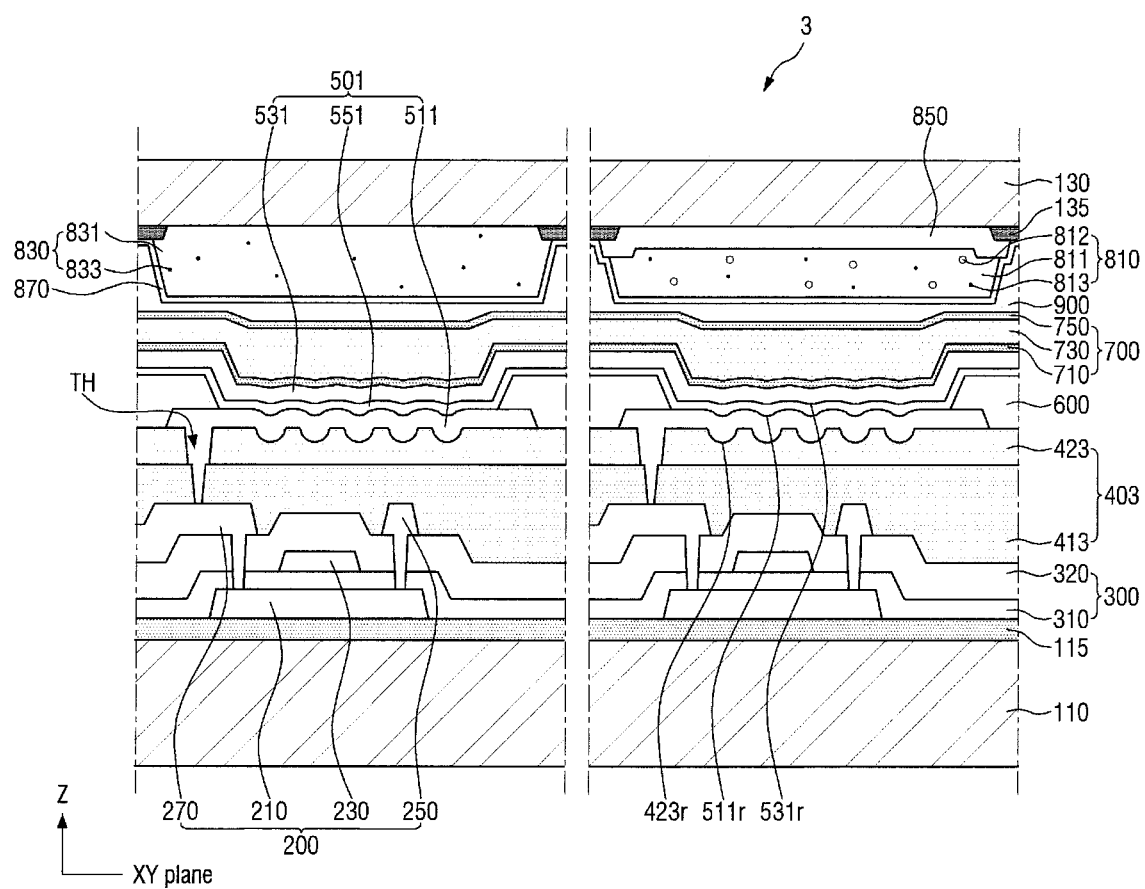
FIGS. 7-12 are cross-sectional views of the display device according to still another embodiment of the present invention, respectively.

FIG. 7 is a cross-sectional view of a display device according to still another embodiment of the present invention.

Referring to FIG. 7, a display device 3 according to this embodiment includes an organic layer 403 disposed on the driving element layers 200 and 300. The display device 3 is different from the display device 1 according to the embodiment of FIG. 2 and the like in that the organic layer 403 includes a first organic layer 413 disposed on the driving element layers 200 and 300, and a second organic layer 423 disposed on the first organic layer 413, and one surface (e.g., the upper surface in FIG. 7) of the second organic layer 423 facing the light-emitting element 501 partially has an uneven surface.

In an exemplary embodiment, the first organic layer 413 may be a flattening layer disposed directly on the driving element layers 200 and 300 to at least partially compensate for the level difference and flatten the level difference. The upper surface of the first organic layer 413 facing the second organic layer 423 may be substantially flat. The first organic layer 413 may include a positive photosensitive material or a negative photosensitive material.

The second organic layer 423 may be disposed on the first organic layer 413. The second organic layer 423 may be in contact with the first electrode 511 and the pixel defining layer 600. The second organic layer 423 may include a material that is the same as or different from the first organic layer 413. For example, the second organic layer 423 may include a positive photosensitive material.

The surface of the second organic layer 423 that is in contact with the first electrode 511 may have a first uneven pattern 423r. The partial surface of the second organic layer 423 that is in contact with the first electrode 511 and the surface of the second organic layer 423 that is in contact with the pixel defining layer 600 may have a flat surface.

The first uneven pattern 423r may be disposed substantially at the central part of each pixel, for example, substantially at the central part of the light-emitting region of each pixel. The first uneven pattern 423r may be a dot-shaped recess pattern having a substantially circular shape on a plane or a recess pattern having a linear shape on a plane. For example, the first uneven pattern 423r may be a recess pattern depressed downward from the reference surface of the second organic layer 423 (e.g., the flat surface or the top surface of the second organic layer 423).

In some embodiments, the first electrode 511 and the second electrode 531 may have a second uneven pattern 511r and a third uneven pattern 531r, which overlap the first uneven pattern 423r of the second organic layer 423 in the third direction Z, respectively, and have a shape and arrangement corresponding to the first uneven pattern 423r. Because the sizes, shapes, arrangements, functions, and the like of the first uneven pattern 423r, the second uneven pattern 511r and the third uneven pattern 531r have already been described above, the duplicate descriptions will not be provided.

Figure 8:
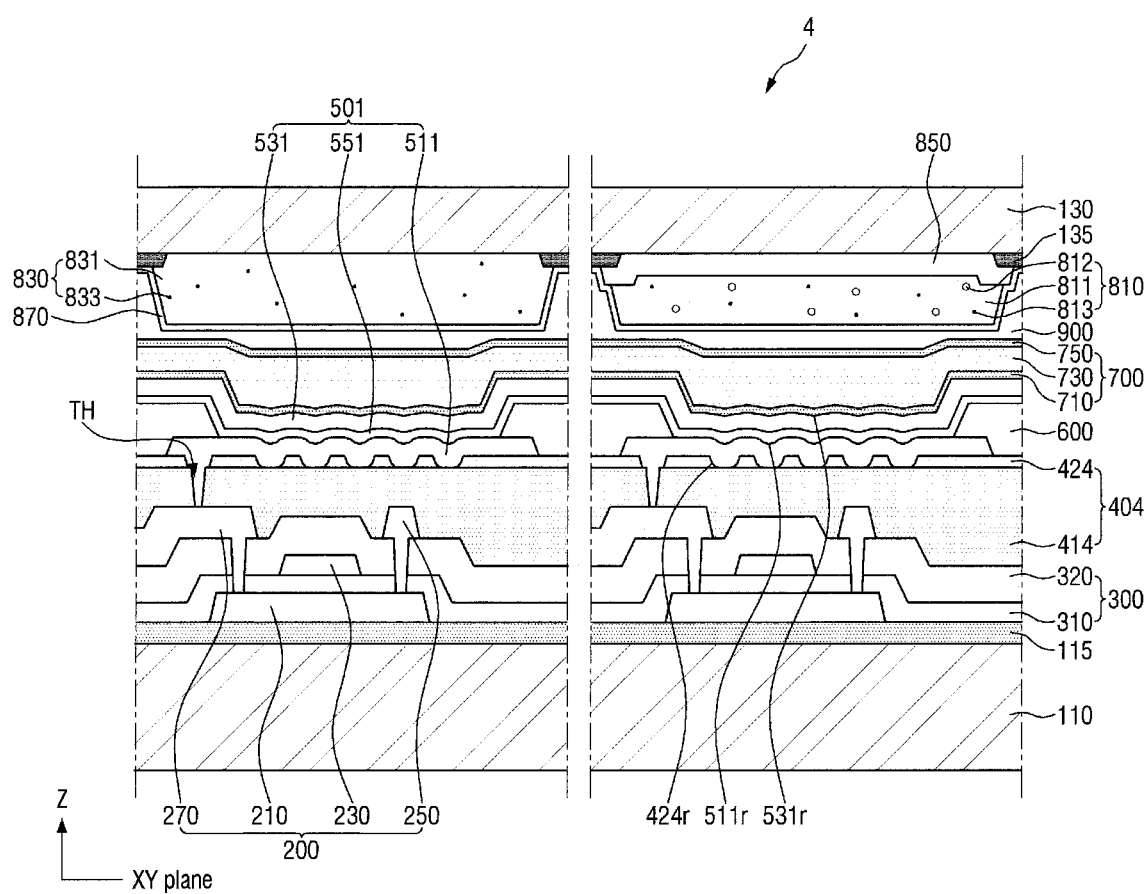

FIG. 8 is a cross-sectional view of a display device according to still another embodiment of the present invention.

Referring to FIG. 8, a display device 4 according to this embodiment includes an organic layer 404 disposed on the driving element layers 200 and 300. The display device 4 is different from the display device 3 according to the embodiment of FIG. 7 in that the organic layer 404 includes a first organic layer 414 disposed on the driving element layers 200 and 300, and a second organic layer 424 disposed on the first organic layer 414, and the first organic layer 414 is partially exposed by the uneven pattern 424r of the second organic layer 424.

In an exemplary embodiment, the surface of the second organic layer 424 may have a first uneven pattern 424r. The first uneven pattern 424r may be disposed substantially at the central part of each pixel, for example, substantially at the central part of the light-emitting region of each pixel.

The first uneven pattern 424r may be a dot-shaped recess pattern having a substantially circular shape on a plane or a linear recess pattern on a plane. The first uneven pattern 424r penetrates through the second organic layer 424 and may partially expose the flat surface of the first organic layer 414. The second organic layer 424 may include a material that is the same as or different from the first organic layer 414. For example, the second organic layer 424 may include a positive photosensitive material.

The remaining portions of the second organic layer 424 other than the first uneven pattern 424r, which is a recess pattern of a dot shape, may have approximately a lattice shape on a plane, but the present invention is not limited thereto.

In some embodiments, the first electrode 511 and the second electrode 531 may have a second uneven pattern 511r and a third uneven pattern 531r, which overlap the first uneven pattern 424r of the second organic layer 424 in the third direction Z, respectively, and have a shape and arrangement corresponding to the first uneven pattern 424r. The sizes, shapes, arrangements, functions, and the like of the first uneven pattern 424r, the second uneven pattern 511r, and the third uneven pattern 531r have already been described above, and thus redundant explanations will not be provided.

Figure 9:
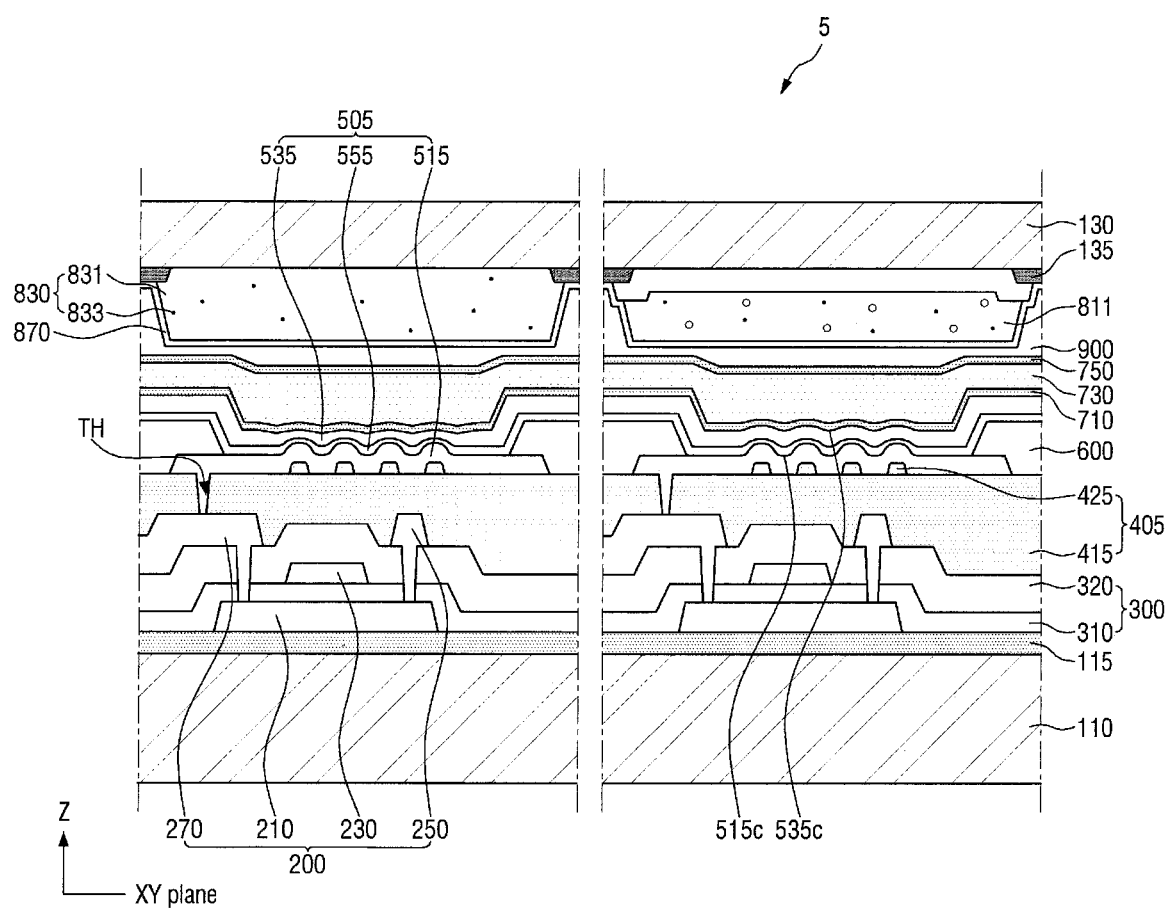

FIG. 9 is a cross-sectional view of a display device according to still another embodiment of the present invention.

Referring to FIG. 9, a display device 5 according to this embodiment includes an organic layer 405 disposed on the driving element layers 200 and 300. The display device 5 is different from the display device 3 according to the embodiment of FIG. 7 in that the organic layer 405 includes a first organic layer 415 disposed on the driving element layers 200 and 300, and a second organic layer 425 disposed on the first organic layer 415, and the second organic layer 425 is a dot-shaped convex pattern.

In an exemplary embodiment, the surface of the second organic layer 425 may form a first uneven pattern. The first uneven pattern formed by the second organic layer 425 may be disposed substantially at the central part of each pixel, for example, substantially at the central part of the light-emitting region of each pixel.

The first uneven pattern formed by the second organic layer 425 may be a dot-shaped convex pattern having a substantially circular shape on a plane, or a linear convex pattern on a plane. The first uneven pattern may be disposed on the first organic layer 415. The flat surface of the first organic layer 415 may be exposed to the space between the adjacent first uneven patterns. The flat surface of the exposed first organic layer 415 may have an approximately lattice shape on a plane, but the present invention is not limited thereto. The second organic layer 425 may include a material that is the same as or different from the first organic layer 415. For example, the second organic layer 425 may include a negative photosensitive material.

In some embodiments, the first electrode 515 and the second electrode 535 may have a second uneven pattern 515c and a third uneven pattern 535c, which overlap the first uneven pattern formed by the second organic layer 425 in the third direction Z, respectively, and have a shape and arrangement corresponding to the first uneven pattern. Although the present invention is not limited thereto, the second uneven pattern 515c and the third uneven pattern 535c may be caused by the convex pattern formed by the surface of the second organic layer 425, respectively. For example, the second uneven pattern 515c and the third uneven pattern 535c may be dot-shaped convex patterns similarly to the first uneven pattern. The sizes, shapes, arrangements, functions, and the like of the first uneven pattern, the second uneven pattern 515c, and the third uneven pattern 535c have already been described above, and therefore, their description will not be repeated here.

Figure 10:
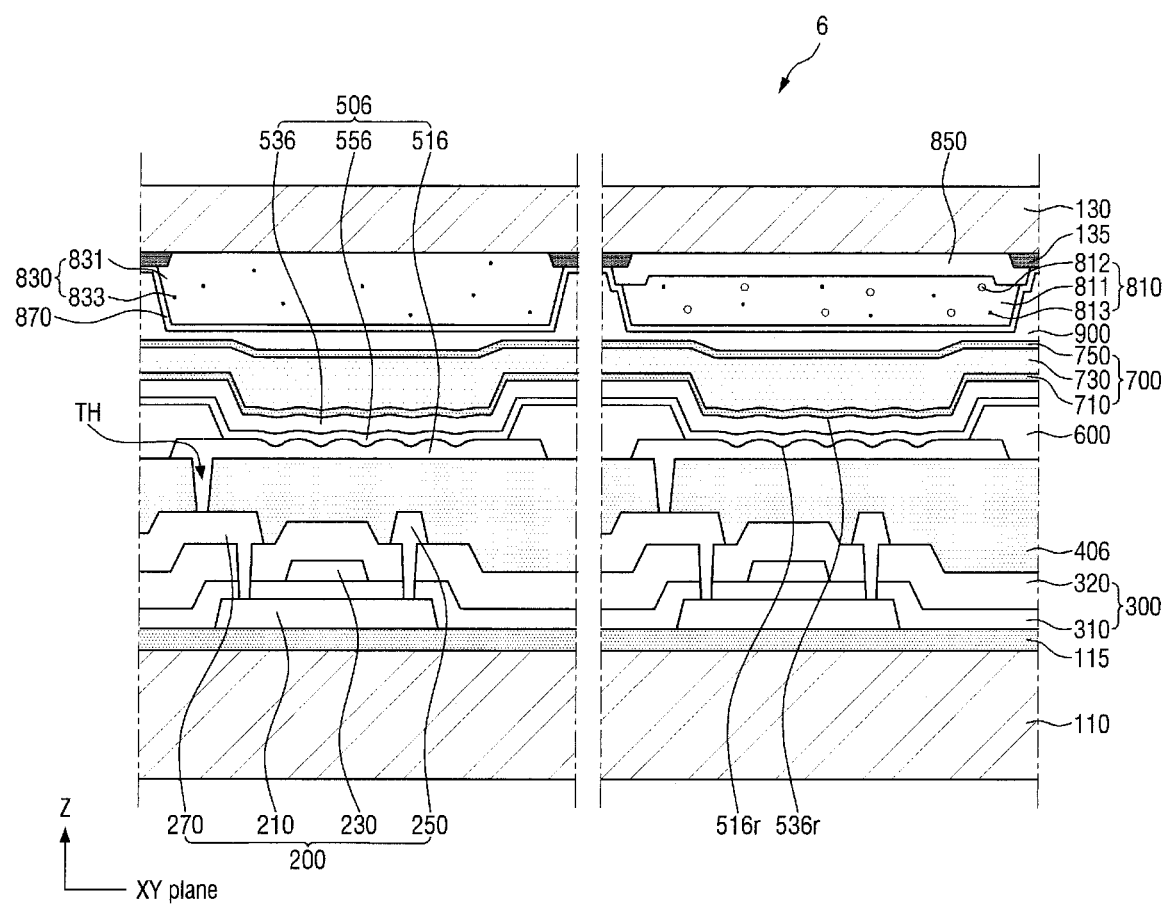

FIG. 10 is a cross-sectional view of a display device according to still another embodiment of the present invention.

Referring to FIG. 10, the organic layer 406 of the display device 6 according to this embodiment is different from the display device 1 according to the embodiment of FIG. 2 and the like in that the organic layer 406 has no uneven pattern.

One surface (e.g., the upper surface in FIG. 10) of the organic layer 406 facing the light-emitting element 506 may have a substantially flat surface. The first electrode 516 may be placed directly on the organic layer 406.

In an exemplary embodiment, the upper surface of the first electrode 516 may have a partially uneven surface. For example, the upper surface of the first electrode 516 may have a second uneven pattern 516r. The lower surface of the first electrode 516 that is in contact with the organic layer 406 may be substantially flat. That is, the first electrode 516 may have a non-uniform thickness. The second uneven pattern 516r on the upper surface of the first electrode 516 may form an optical interface capable of causing light scattering at the interface with the organic light-emitting layer 556.

Further, the upper surface and the lower surface of the second electrode 536 may partially have uneven surfaces. For example, the upper surface of the second electrode 536 may have a third uneven pattern 536r. The third uneven pattern 536r may be a recess pattern depressed from the reference surface, but the present invention is not limited thereto. The third uneven pattern 536r may overlap the second uneven pattern 516r in the third direction Z and may have a shape and an arrangement corresponding to the second uneven pattern 516r. The third uneven pattern 536r of the upper surface of the second electrode 536 may form an optical interface capable of causing the light scattering at the interface with the first inorganic encapsulation layer 710. Further, the uneven surface of the lower surface of the second electrode 536 may form an optical interface capable of causing the light scattering at the interface with the organic light-emitting layer 556.

As a non-limiting example, the second uneven pattern 516r is formed by partially etching or ashing the first electrode 516, and the third uneven pattern 536r may be caused by the second uneven pattern 516r.

Each of the second uneven pattern 516r and the third uneven pattern 536r may have a substantially circular dot shape on a plane or may have a linear shape. Because the second uneven pattern 516r and the third uneven pattern 536r are described above, their description will not be repeated here.

Figure 11:
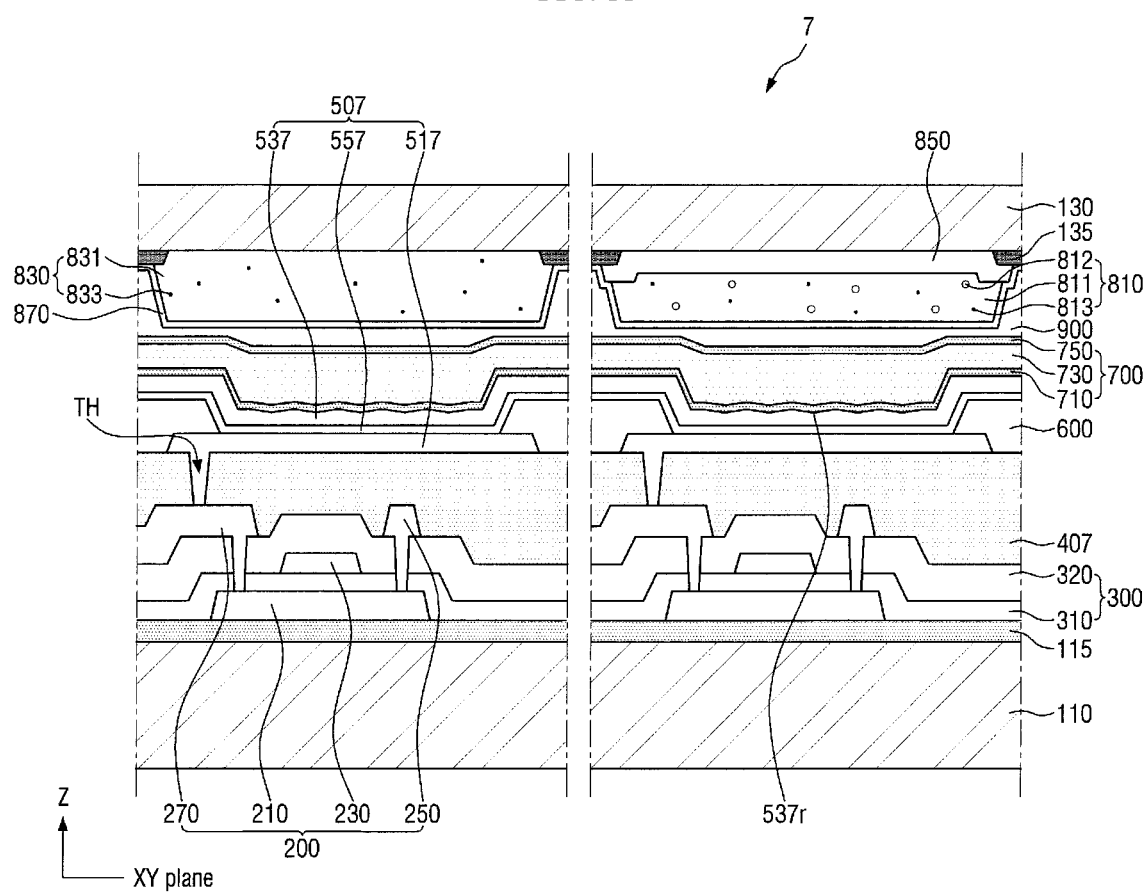

FIG. 11 is a cross-sectional view of a display device according to still another embodiment of the present invention.

Referring to FIG. 11, a first electrode 517 of a display device 7 according to this embodiment differs from the display device 6 according to the embodiment of FIG. 10 in that the first electrode 517 does not have an uneven pattern.

One surface (e.g., the upper surface in FIG. 11) of the first electrode 517 facing the organic light-emitting layer 557 may have a substantially flat surface. In an exemplary embodiment, the upper surface of the second electrode 537 may have a partially uneven surface. For example, the upper surface of the second electrode 537 may have a third uneven pattern 537r. The lower surface of the second electrode 537 that is in contact with the organic light-emitting layer 557 may be substantially flattened. That is, the second electrode 537 may have a non-uniform thickness. The third uneven pattern 537r of the upper surface of the second electrode 537 may form an optical interface capable of causing the light scattering at the interface with the first inorganic encapsulation layer 710. As a non-limiting example, the third uneven pattern 537r may be formed by partially etching or ashing the second electrode 537.

The third uneven pattern 537r may have a substantially circular dot shape on a plane or may have a linear shape. Because the third uneven pattern 537r has been described above, their description will not be repeated here.

Figure 12:
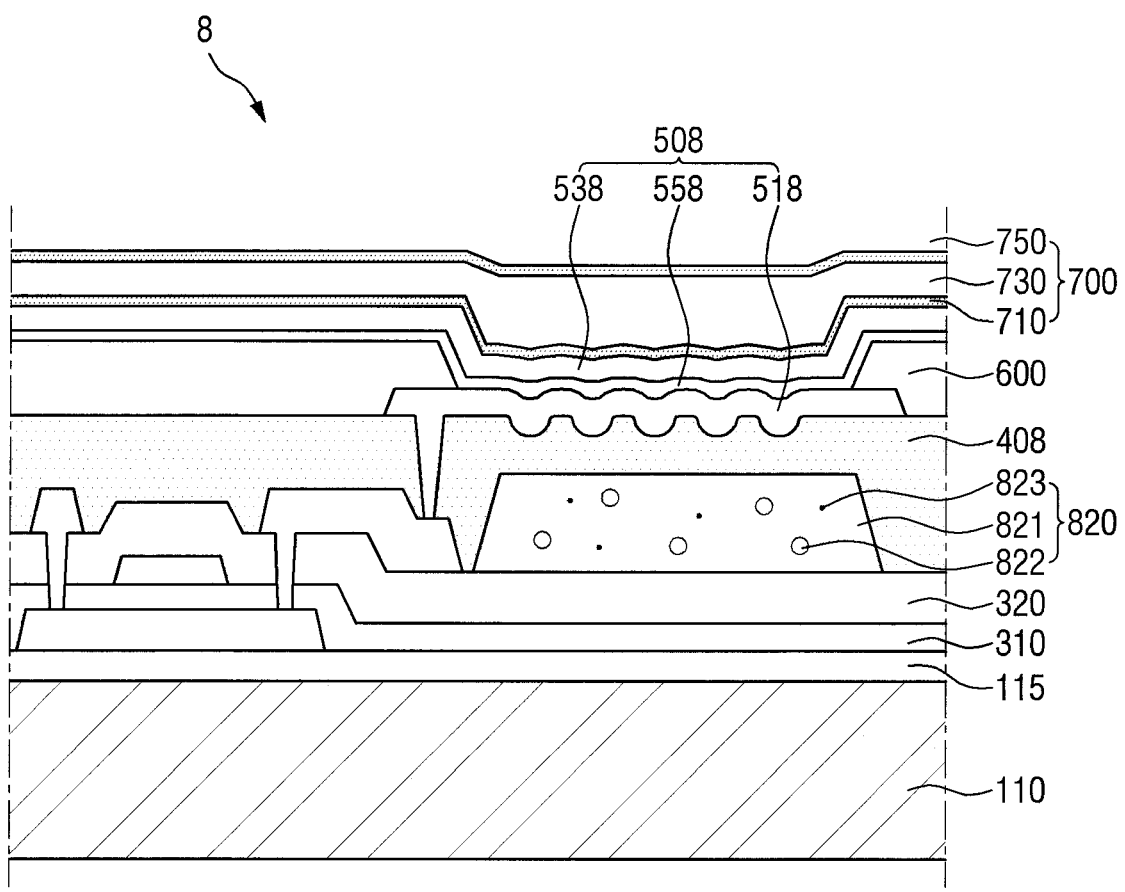

FIG. 12 is a cross-sectional view of a display device according to still another embodiment of the present invention.

Referring to FIG. 12, a light-emitting element 508 of a display device 8 according to the present embodiment differs from the display device 1 according to the embodiments of FIG. 2 or the like in that the light-emitting element 508 is a back light-emitting type light-emitting element.

In the exemplary embodiment, the light-emitting element 508 may emit light to the side of the first electrode 518, that is, to the lower side of FIG. 12 to provide light to the color conversion pattern 820 side. The first electrode 518 may be an anode electrode made of a translucent material and the second electrode 538 may be a cathode electrode.

The color conversion pattern 820 may be disposed on the side of the first electrode 518 of the light-emitting element 508. That is, the color conversion pattern 820 and the second electrode 538 may be spaced apart from each other with the first electrode 518 interposed therebetween. As a non-limiting example, the color conversion pattern 820 may be disposed between the driving element layers 200 and 300 and the organic layer 408. However, in other embodiments, the color conversion pattern 820 may be disposed between the first insulating layer 310 and the second insulating layer 320, or may be disposed between the base substrate 110 and the driving element layers 200 and 300, or may be disposed on the lower surface of the base substrate 110.

Hereinafter, a method of manufacturing the display device according to the embodiments of the present invention will be described.

FIGS. 13 to 17 are cross-sectional views illustrating the method of manufacturing the display device according to an embodiment of the present invention.

Figure 13:
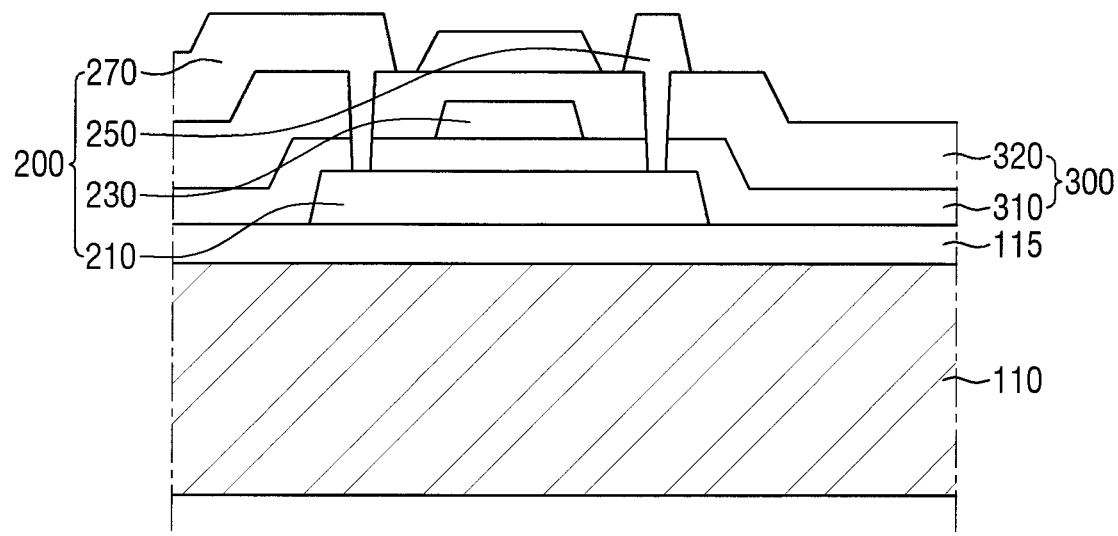
FIGS. 13-17 are cross-sectional views illustrating a method of manufacturing the display device according to an embodiment of the present invention.

First, referring to FIG. 13, driving element layers 200 and 300, which include a thin film transistor 200 including an active layer 210, a gate electrode 230, a drain electrode 250 and a source electrode 270, and a plurality of insulating layers 310, are formed on a base substrate 110. Because the thin film transistor 200, the first insulating layer 310, and the second insulating layer 320 have been described above, their description will not be provided.

Figure 14:
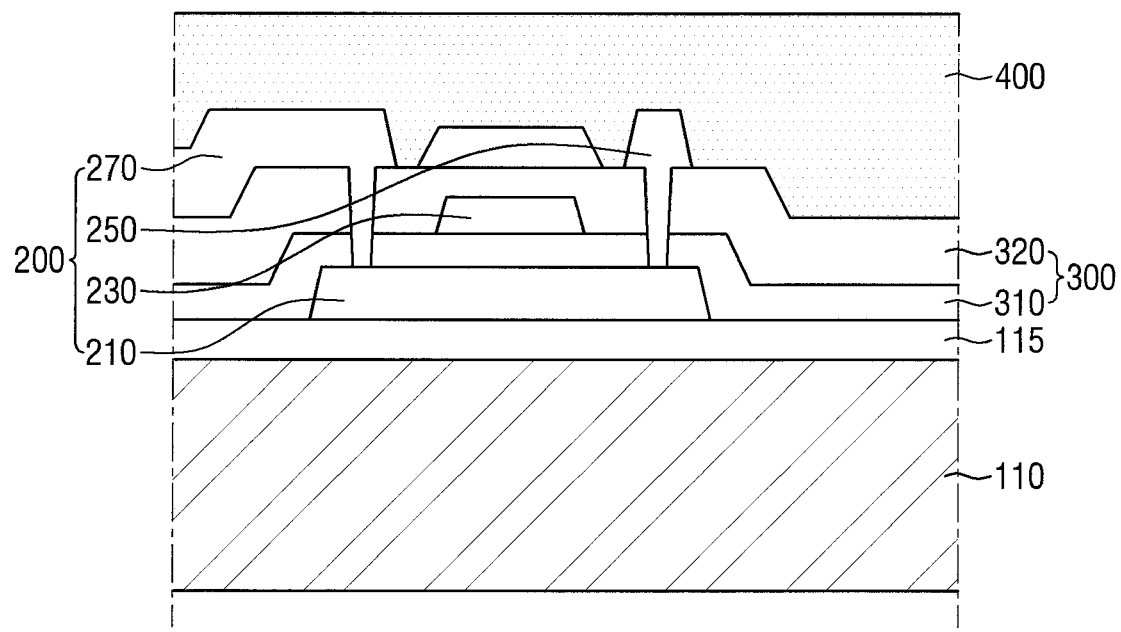

Subsequently, referring to FIG. 14, an organic layer 400 is formed on the driving element layers 200 and 300. At this step, the upper surface of the organic layer 400 may be substantially flat. In some embodiments, the step of forming the organic layer 400 having the flat surface may include a step of providing a composition for forming an organic layer on the driving element layers 200 and 300, and a step of baking the composition for forming the organic layer to at least partially cure the composition.

Figure 15:
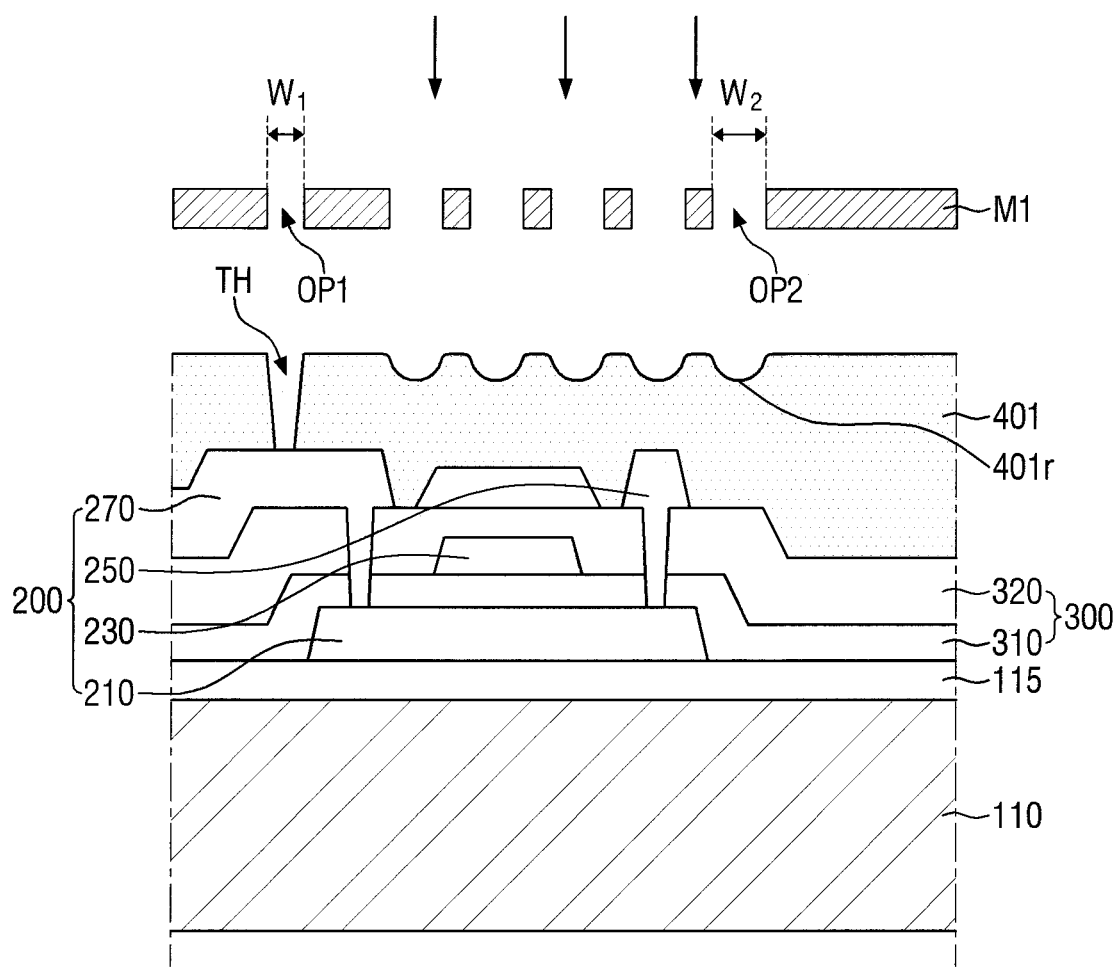

Next, referring to FIG. 15, an organic layer 401 having a through-hole (TH) and a first uneven pattern 401r is formed. The through-hole (TH) of the organic layer 401 and the first uneven pattern 401r may be formed at the same time through an exposure process using one mask (M1).

In an exemplary embodiment, the through-hole (TH) may have an approximately circular shape from a plan view. Further, the first uneven pattern 401r may be a circular dot shape on a plane or a linear recess pattern. FIG. 15 illustrates a configuration in which the width of the through-hole (TH) is smaller than the width on the plane of the first uneven pattern 401r, for convenience of explanation, but the width of the through-hole (TH) may be larger than the width of the first uneven pattern 401r.

The mask (M1) may have a first opening (OP1) at a position corresponding to the through-hole (TH), and a plurality of second openings (OP2) at positions corresponding to the first uneven pattern 401r. In an exemplary embodiment, the width ($W_1$) of the first opening (OP1) may be about 5 times or more, about 6 times or more, or about 7 times or more of the width ($W_2$) of the second opening (OP2). While FIG. 15 illustrates a configuration in which the width ($W_1$) of the first opening (OP1) of the mask M1 is smaller than the width ($W_2$) of the second opening (OP2) of the mask M1 for convenience of explanation, the width ($W_1$) of the first opening (OP1) is larger than the width ($W_2$) of the second opening (OP2).

The amount of light irradiated from the upper side of the mask (M1) to the side of the organic layer 401 may be substantially uniform. Because the amount of light irradiated is substantially uniform and the first opening (OP1) has a remarkably larger width than the second opening (OP2), the through-hole (TH) penetrating the organic layer 401 to expose a part of the source electrode 270 may be formed at a position corresponding to the first opening (OP1). At the same time, the first uneven pattern 401r in which the surface of the organic layer 401 is partially recessed may be formed at a position corresponding to the second opening (OP2). That is, by setting the width ($W_1$) of the first opening (OP1) and the width ($W_2$) of the second opening (OP2) to have a set or predetermined relationship, the through-hole (TH) penetrating the organic layer 401 is formed at the position corresponding to the first opening (OP1), and the first uneven pattern 401r having a shallower depth than the through-hole (TH) may be formed at the position corresponding to the second opening (OP2) having a remarkably smaller width than the first opening (OP1).

FIG. 15 exemplifies a case where the organic layer 401 includes a positive photosensitive material in which the binding between the polymers is at least partially cut off at the exposure part, and the exposure part is removed. However, in another embodiment, the organic layer 401 may include a negative photosensitive material.

Figure 16:
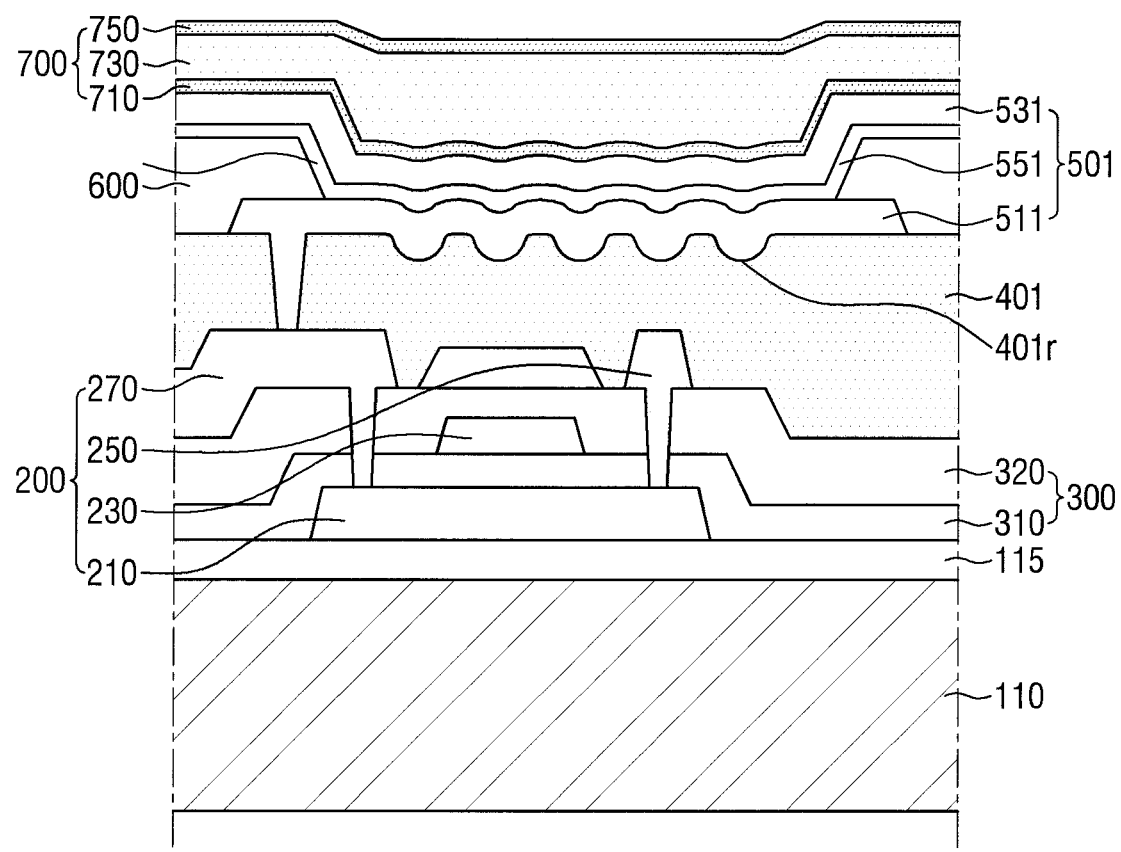

Next, referring to FIG. 16, a light-emitting element 501 including a first electrode 511, a second electrode 531, and an organic light-emitting layer 551 interposed therebetween, and an encapsulation layer 700 is formed on the organic layer 401. Because the light-emitting element 501 and the encapsulation layer 700 have been described above, their description will not be repeated here.

Figure 17:
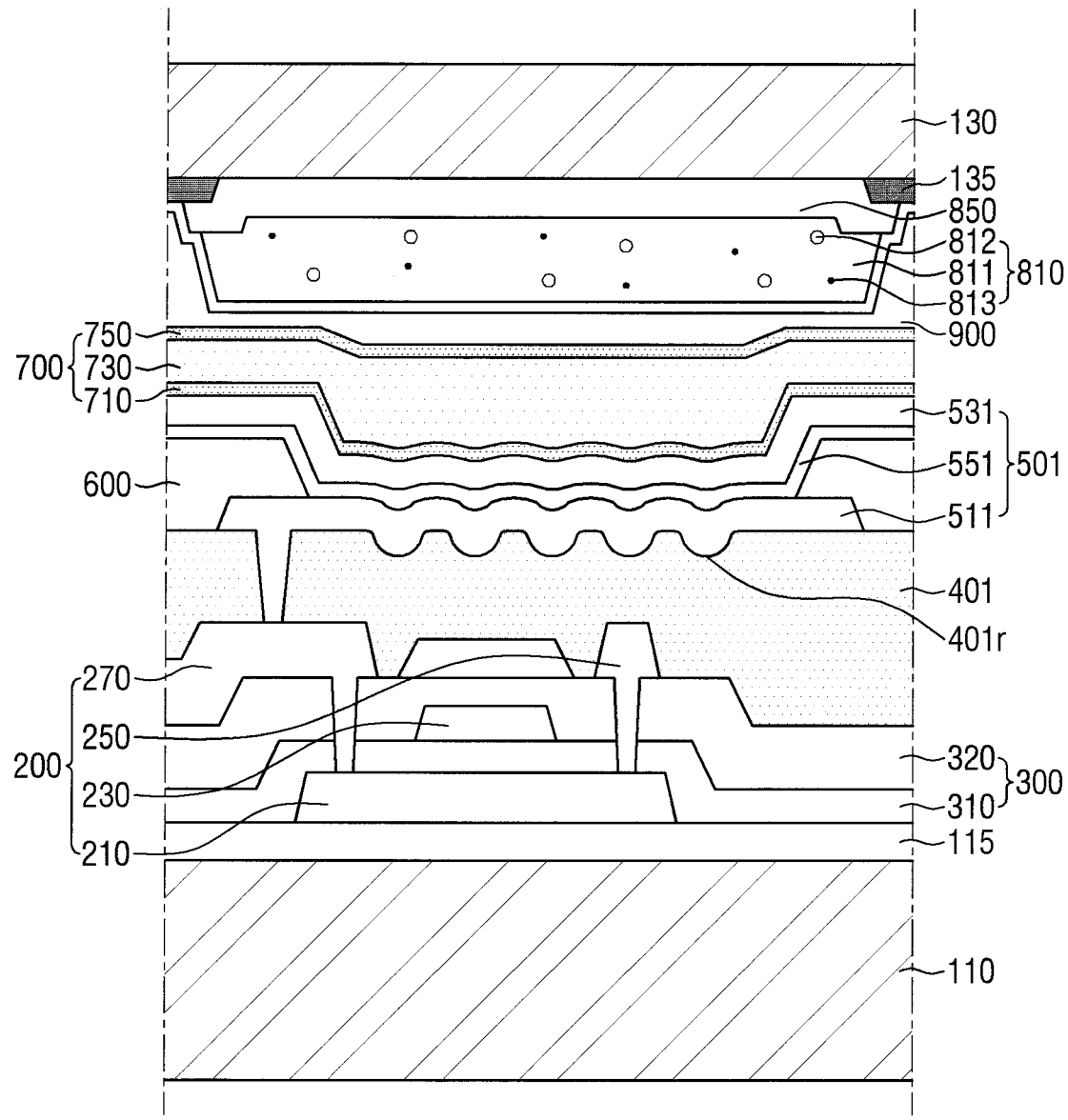

Next, referring to FIG. 17, color conversion patterns 810 and 830 are formed on one surface of the counter substrate 130, and an adhesive layer 900 is interposed between the encapsulation layer 700 and the color conversion patterns 810 and 830 to combine them.

Because the size, shape, arrangement, and function of the first uneven pattern 401r and, the light-emitting region, the non-light-emitting region, the pattern region, the non-pattern region and the arrangement relationship between them are described above, their description will not be repeated here.

FIGS. 18 to 21 are cross-sectional views illustrating a method of manufacturing a display device according to another embodiment of the present invention.

Figure 18:
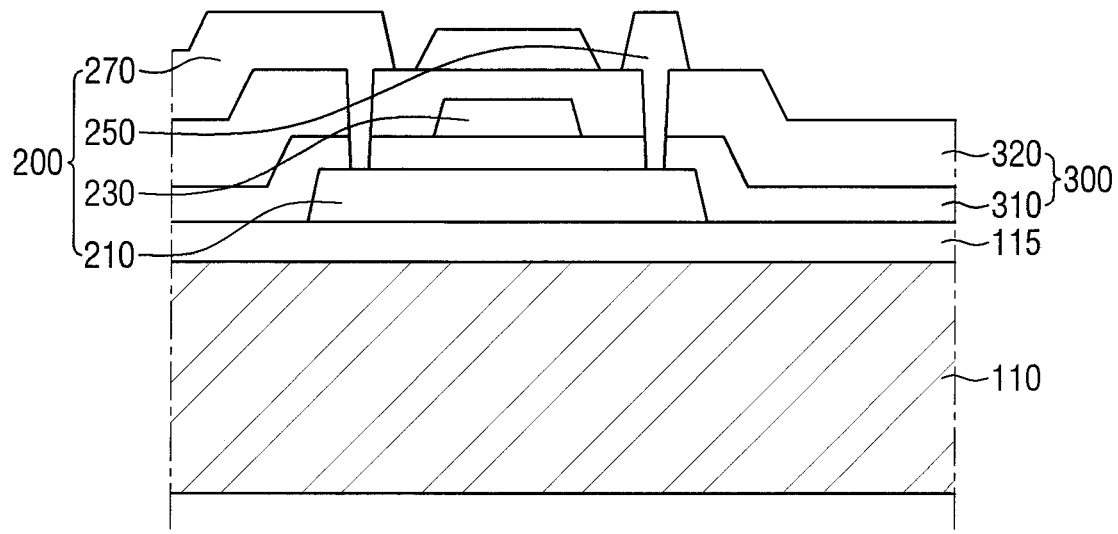
FIGS. 18-21 are cross-sectional views illustrating a method of manufacturing a display device according to another embodiment of the present invention.

First, referring to FIG. 18, the driving element layers 200 and 300 including the thin film transistor 200 and the plurality of insulating layers 310 are formed on the base substrate 110.

Figure 19:
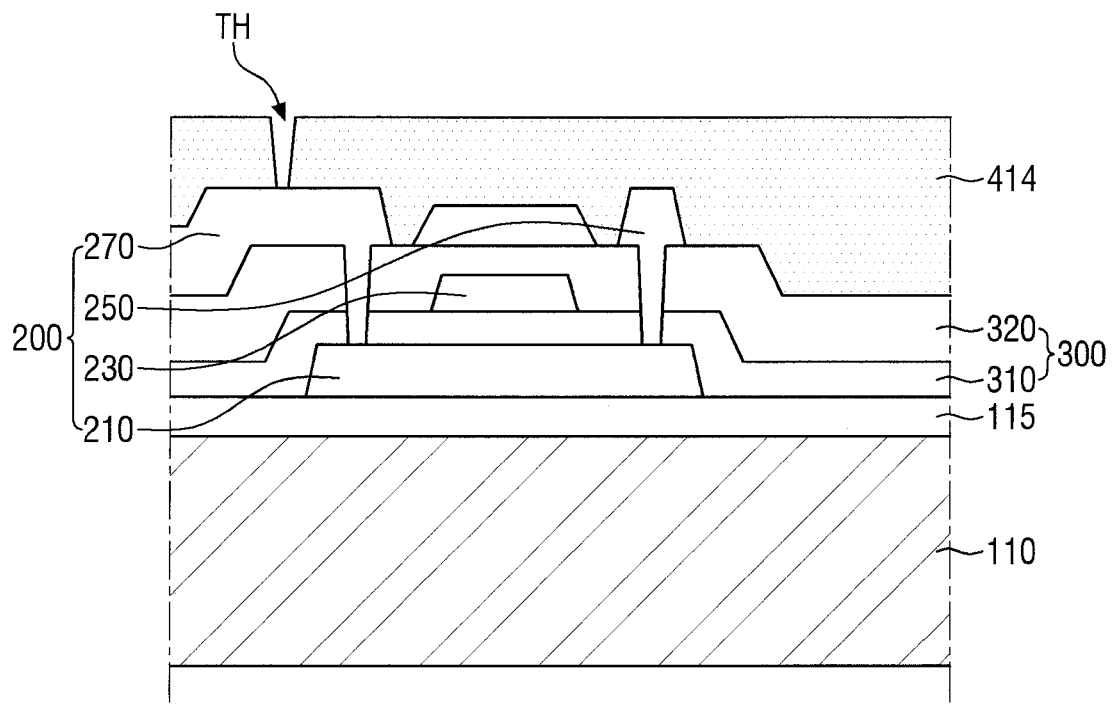

Next, referring to FIG. 19, a first organic layer 414 having a through-hole (TH) is formed on the driving element layers 200 and 300. The surface of the first organic layer 414 may be substantially flat. The first organic layer 414 may include a positive photosensitive material or a negative photosensitive material.

Figure 20:
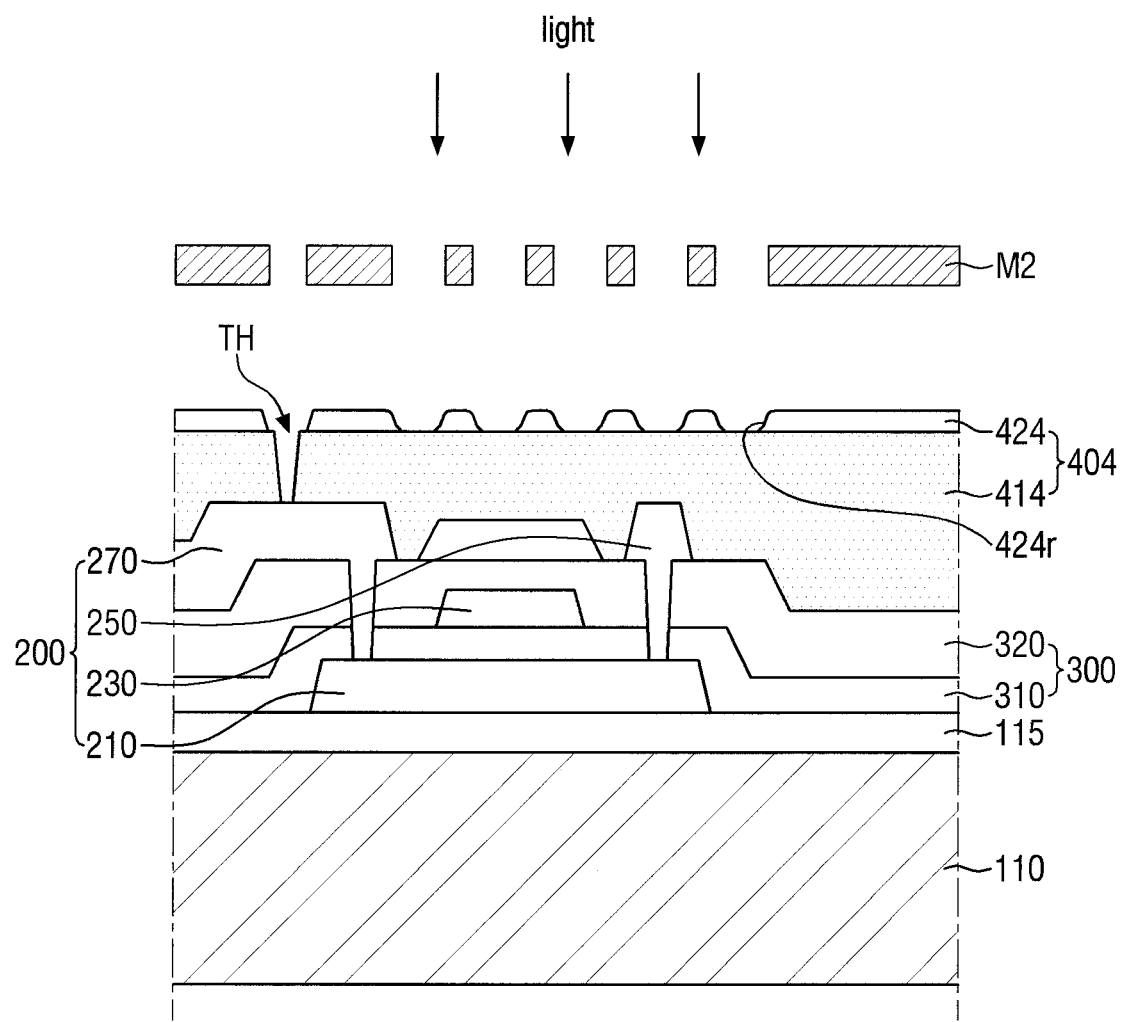

Next, referring to FIG. 20, the through-hole (TH) and the second organic layer 424 having the first uneven pattern 424r are formed on the first organic layer 414. The through-hole (TH) and the first uneven pattern 424r of the second organic layer 424 may be formed at the same time through an exposure process using one mask (M2).

In an exemplary embodiment, the through-hole (TH) may have an approximately circular shape from a plan view. Further, the first uneven pattern 424r may be a circular dot shape on a plane or a linear recess pattern. FIG. 20 illustrates a configuration in which the width of the through-hole (TH) is smaller than the width on the plane of the first uneven pattern 424r, for convenience of explanation, but the width of the through-hole (TH) may be larger than the width of the uneven pattern 424r.

The mask (M2) may have a first opening at a position corresponding to the through-hole (TH), and a plurality of second openings at positions corresponding to the respective first uneven patterns 424r. An organic layer 404 disposed between the driving element layers 200 and 300 and a light-emitting element 501 is formed by a stacked structure of the first organic layer 414 and the second organic layer 424, and a sufficient amount of light is irradiated from the upper side of the mask (M2). Accordingly, the through-hole (TH) penetrating the second organic layer 424 is formed at the position corresponding to the first opening of the mask (M2). At the same time, a through-hole penetrating the second organic layer 424 to expose the flat surface of the first organic layer 414 may be formed at the position corresponding to the second opening of the mask. FIG. 20 illustrates the case where the first uneven pattern 424r of the second organic layer 424 exposes the surface of the first organic layer 414. However, the first uneven pattern 424r may not completely penetrate the second organic layer 424. Also, FIG. 20 illustrates the case where the second organic layer 424 includes a positive photosensitive material in which the bond between the polymers is at least partially cut off at the exposure part and the exposure part is removed. However, in another embodiment, the second organic layer 424 may also include a negative photosensitive material.

Figure 21:
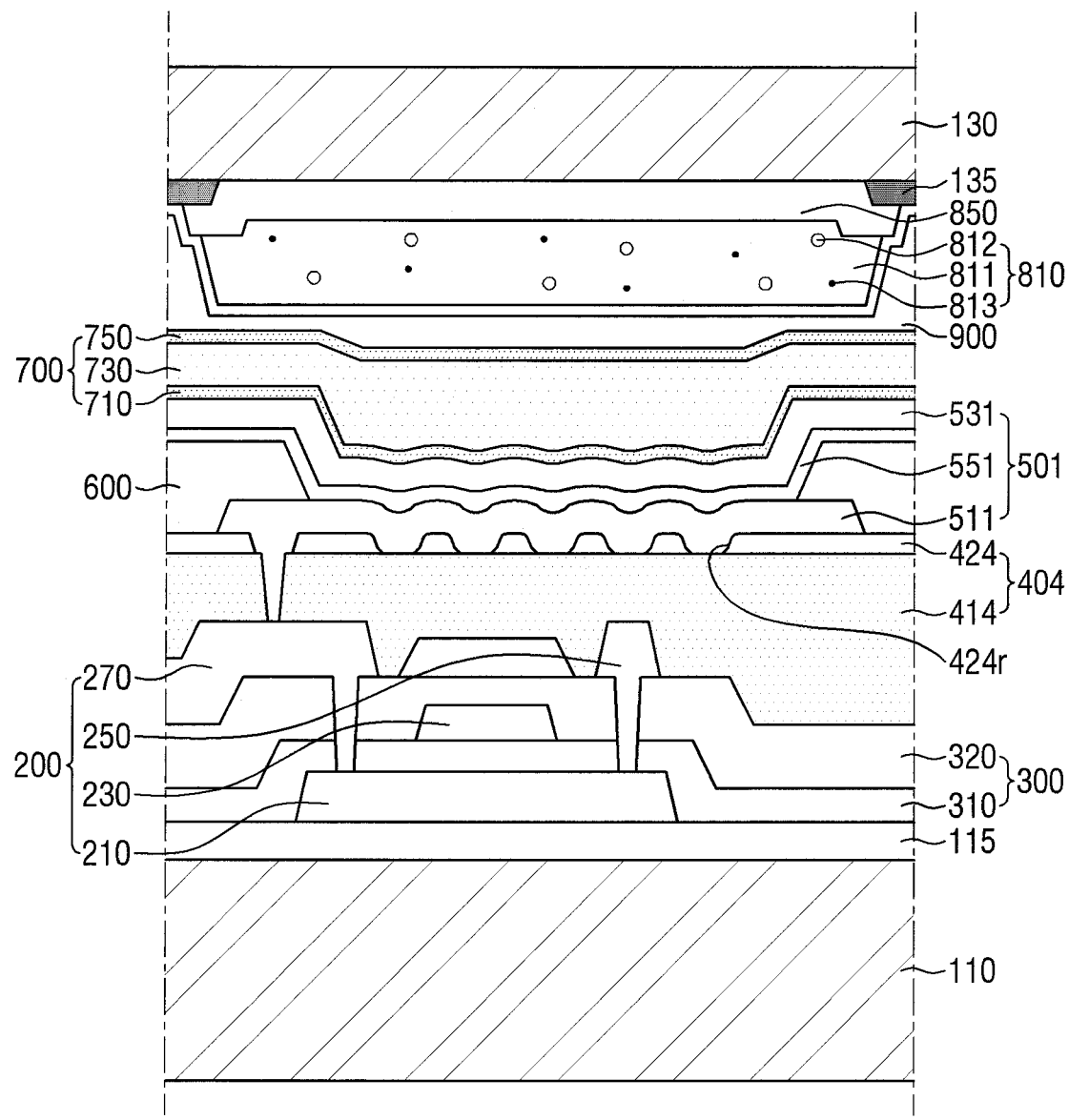

Next, referring to FIG. 21, a display device is manufactured by forming the light-emitting element 501, the encapsulation layer 700, and the color conversion patterns 810 and 830 on the second organic layer 424. In some embodiments, the pixel defining layer 600 is in contact with the second organic layer 424 but may not be in contact with the first organic layer 414.

Because the size, shape, arrangement, and function of the first uneven pattern 424r, and the light-emitting region, the non-light-emitting region, the pattern region, the non-pattern region, and the arrangement relationship between them are described above, their description will not be repeated here.

Figure 22:
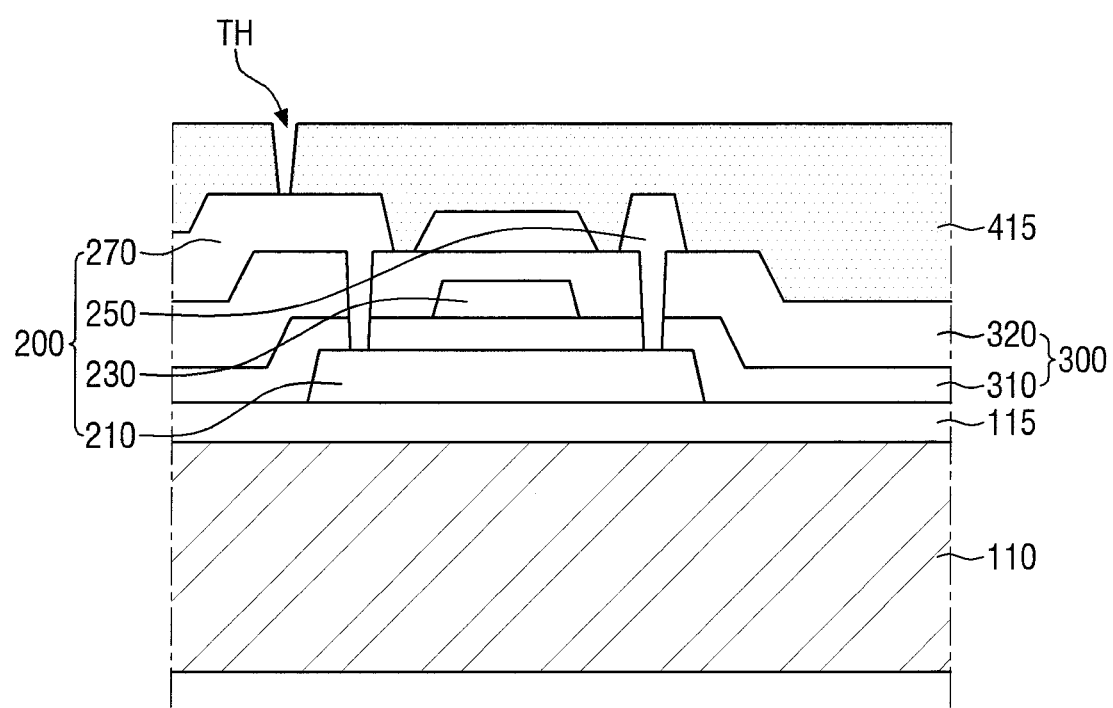
FIGS. 22-24 are cross-sectional views illustrating a method of manufacturing a display device according to still another embodiment of the present invention.
Figure 23:
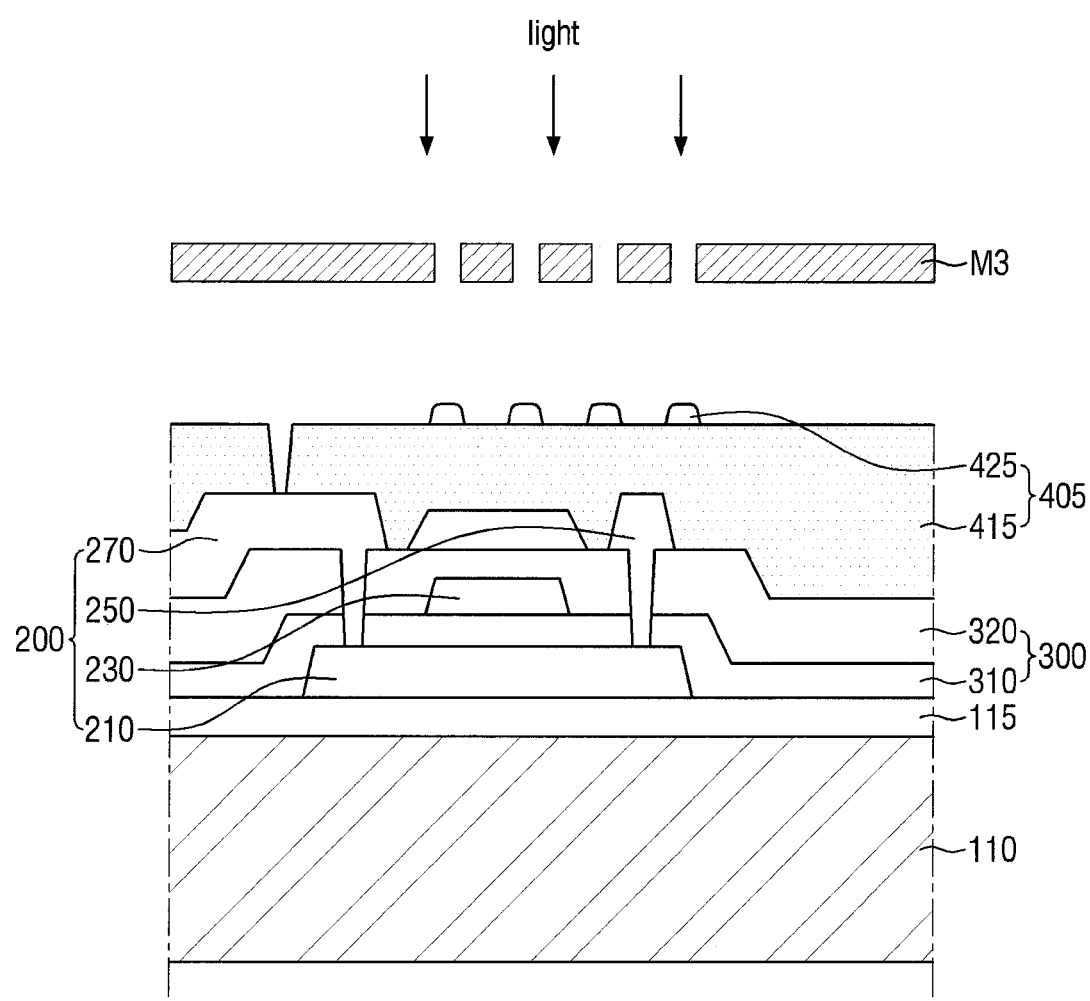
Figure 24:
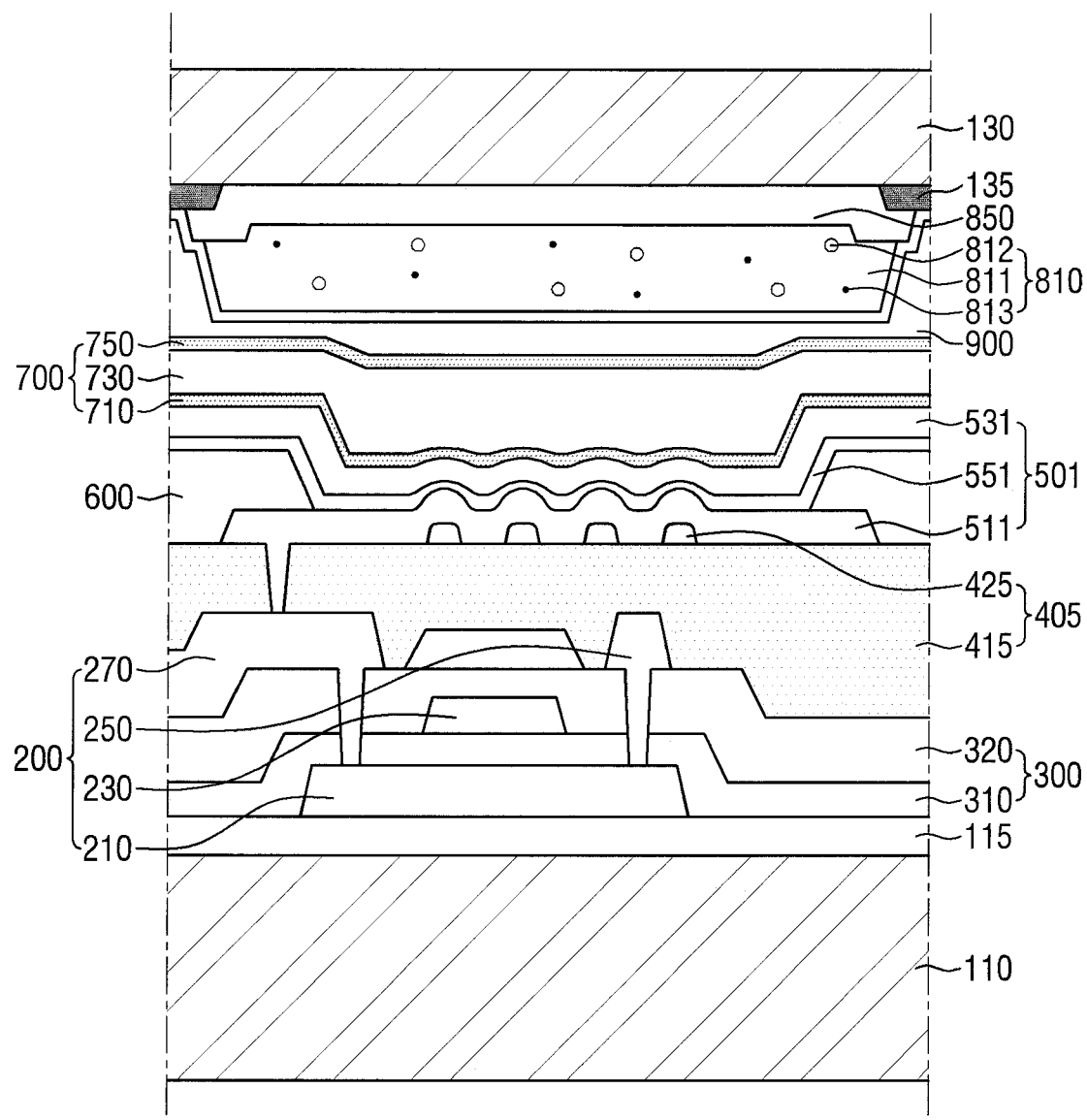

FIGS. 22 to 24 are cross-sectional views illustrating a method of manufacturing a display device according to still another embodiment of the present invention.

First, referring to FIG. 22, driving element layers 200 and 300 including a thin film transistor 200 and a plurality of insulating layers 310, and a first organic layer 415 having a through-hole (TH) are formed on the base substrate 110. The first organic layer 415 may include a positive photosensitive material or a negative photosensitive material.

Subsequently, referring to FIG. 23, a second organic layer 425 having a first uneven pattern is formed on the first organic layer 415. The surface of the second organic layer 425 may form a first uneven pattern. The first uneven pattern may be an approximately circular dot shape on a plane or a linear convex pattern. The first uneven pattern may be formed through an exposure process using a mask.

In an exemplary embodiment, the mask (M3) may have a plurality of openings at positions corresponding to the first uneven patterns. FIG. 23 illustrates the case where the second organic layer 425 includes a negative photosensitive material in which curing of the polymer material occurs at the exposure part. However, in another embodiment, the second organic layer 425 may include a positive photosensitive material.

Next, referring to FIG. 24, a display device is manufactured by forming the light-emitting element 505, the encapsulation layer 700 and the color conversion patterns 810 and 830 on the second organic layer 425. In some embodiments, the pixel defining layer 600 may be in contact with the first organic layer 415.

Because the size, shape, arrangement, and function of the first uneven pattern formed by the second organic layer 425, and the light-emitting region, the non-light-emitting region, the pattern region, the non-pattern region and the arrangement relationship between them are described above, their description will not be repeated here.

Hereinafter, the present invention will be explained in more detail through an Example of the display device according to the present invention, a comparative example, and the experiment examples thereof.

EXAMPLE

A driving element layer required for driving the organic light-emitting element was formed on the glass, and an organic layer was formed on the driving element layer to flatten the upper part of the glass. Using a blank mask, a dot-shaped recess pattern having a through-hole in the organic layer was formed at the same time. The depth of the recess pattern was about 0.5 μm and the width was about 2.0 μm. Also, the distance between the recess patterns was about 2.0 μm. Next, the anode electrode was deposited/patterned to form a pixel defining layer, which covers the end portion of the anode electrode. At this time, the minimum horizontal distance between the pixel defining layer and the recess pattern was about 10.0 μm.

Figure 3:
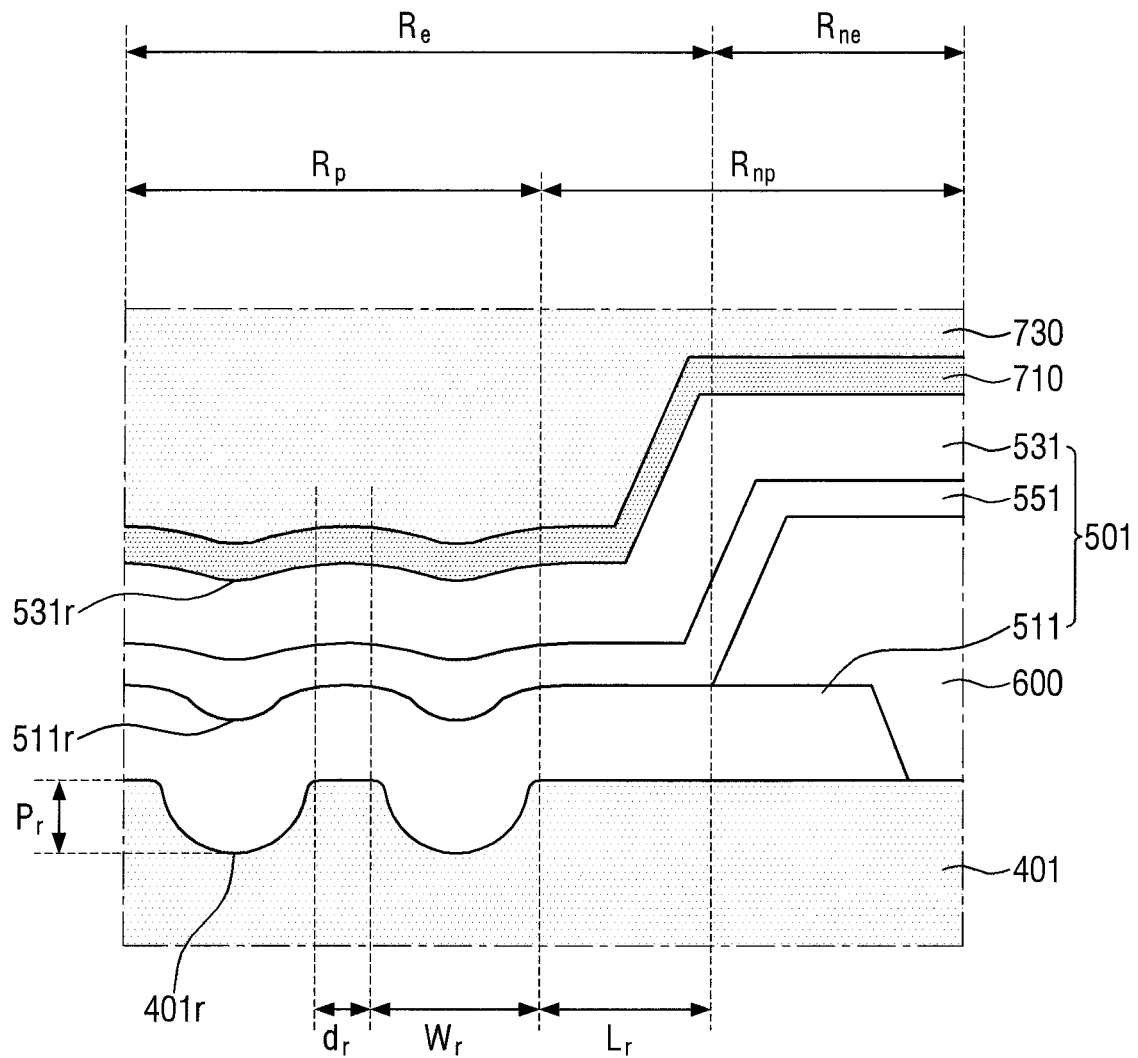
FIG. 3 is a cross-sectional view illustrating a region A of FIG. 2 in an enlarged manner.
Figure 4:
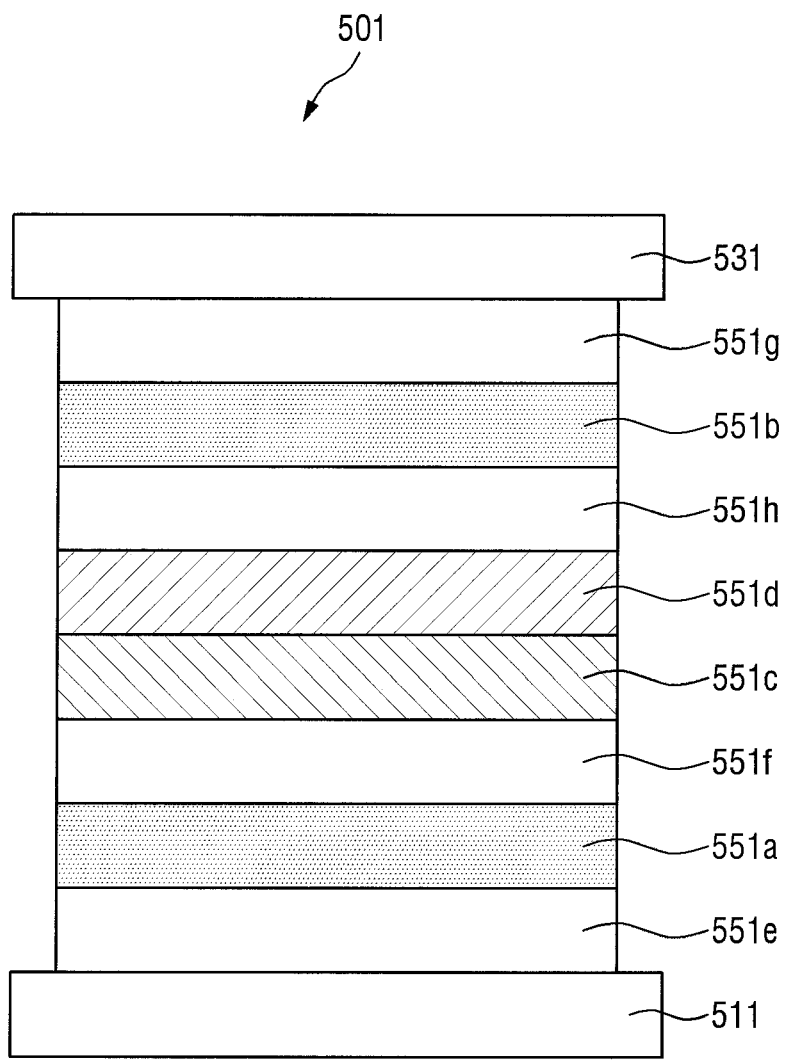
FIG. 4 is a cross-sectional view illustrating a light-emitting element of FIG. 2.

Subsequently, the organic layer and the cathode electrode were vapor-deposited to form a plurality of organic light-emitting elements that emits blue light in the form as illustrated in FIGS. 2 and 3. In this case, it was possible to check that the recess pattern of a shape corresponding to the recess pattern of the organic layer was formed on the anode electrode and the cathode electrode by the recess pattern of the organic layer.

Further, nothing was disposed on one organic light-emitting element to copy a blue pixel, and a color conversion pattern including a green quantum dot material was disposed at a thickness of about 10.0 μm on the top of the other organic light-emitting element to copy the green pixels. Further, the color conversion pattern including a red quantum dot material was disposed at a thickness of about 10.0 μm on the top of the other organic light-emitting element to copy the red pixels. The minimum distance from the cathode electrode to the color conversion pattern was about 10.0 μm. Other detailed structures were configured similarly to the display device of FIG. 2 to produce a test cell having blue, green and red pixels.

Comparative Example

Test cells having blue, green and red pixels were manufactured in the same manner as in the Example, except that the step of forming the recess pattern on the organic layer was omitted and the organic light-emitting element was formed on the flat organic layer. In this case, it was possible to check that the anode electrode and the cathode electrode have a flat surface.

Experimental Example

The organic light-emitting elements of the test cells manufactured through the Example and the comparative example were driven. The brightness of the light emitted through the blue pixel, the green pixel and the red pixel of the test cells was measured, and illustrated in FIGS. 25 and 26.

Figure 25:
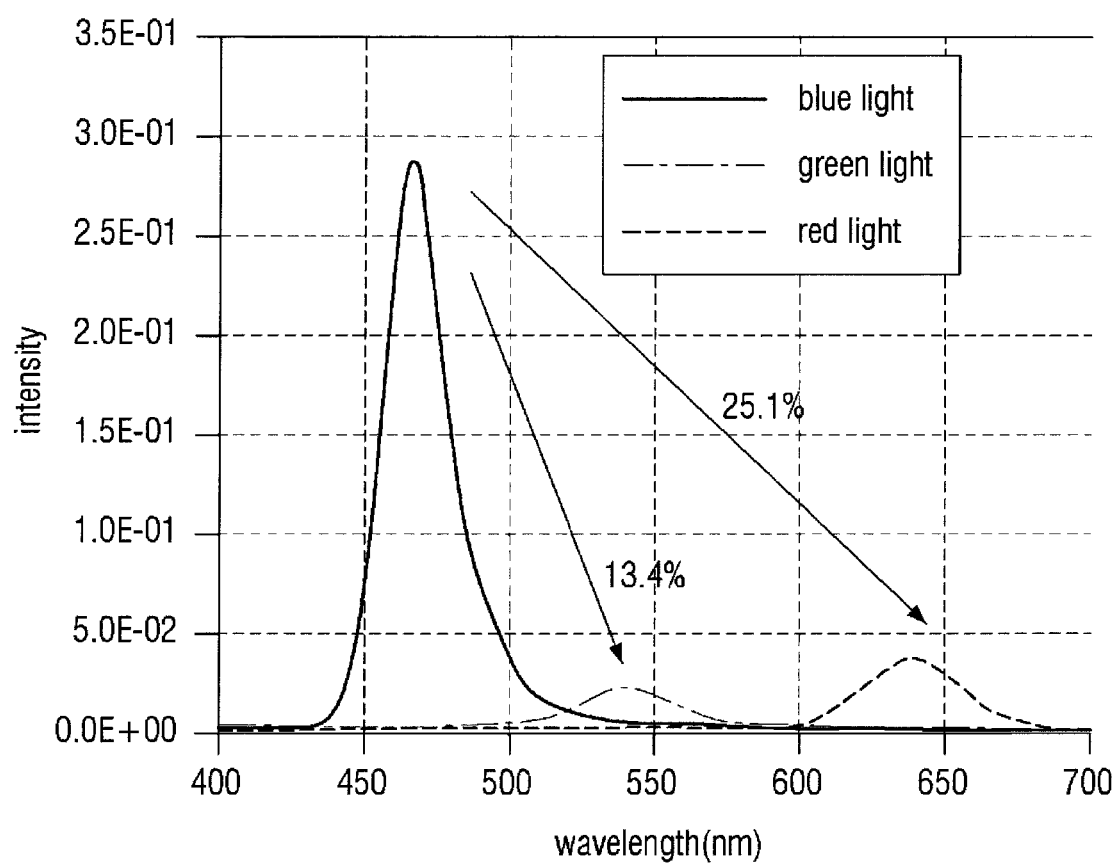
FIGS. 25-26 are spectrum measurement results of emitted light for each pixel of a test cell according to an example embodiment and a comparative example, respectively.
Figure 26:
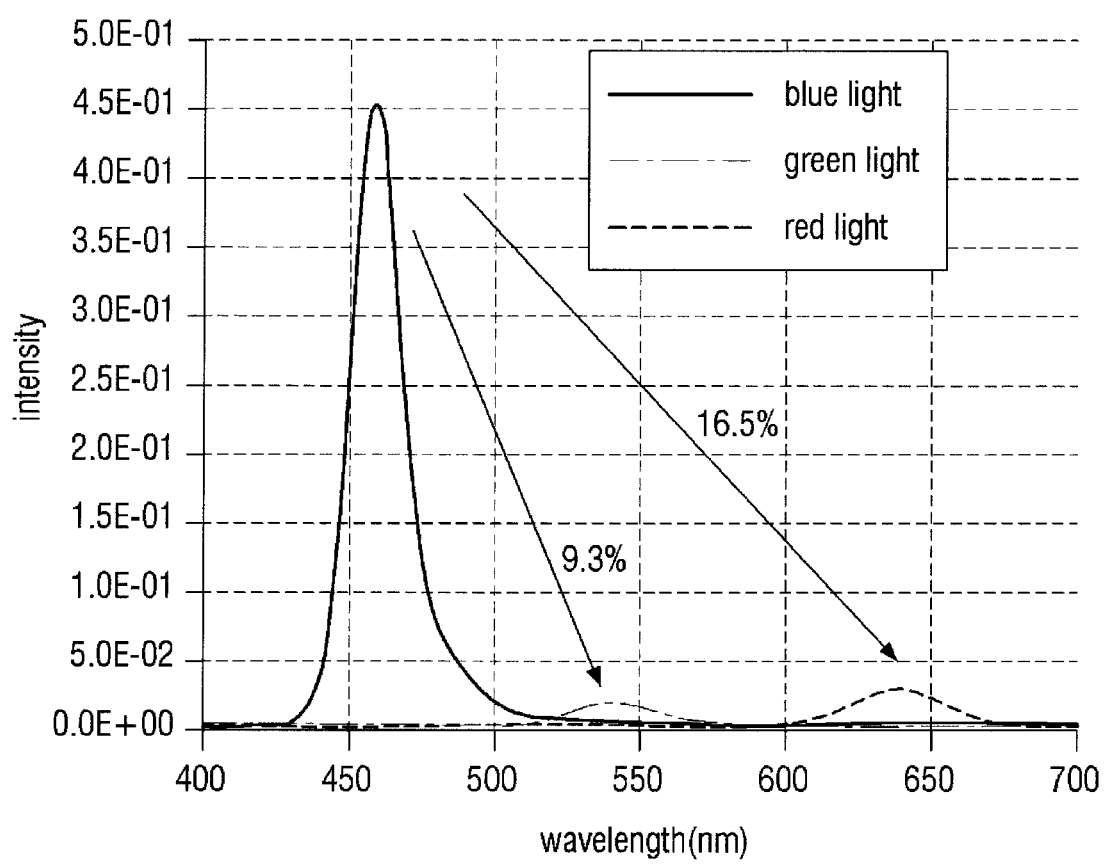

FIG. 25 is a spectrum measurement result of emitted light for each pixel of the test cells according to the Example. FIG. 26 is a spectrum measurement result of emitted light for each pixel of the test cells according to the comparative example. In FIGS. 25 and 26, the luminance of emitted light may be proportional to the lower area of the spectrum.

First, referring to FIG. 25, it is possible to check that the luminance of the light emitted through the green pixels of the test cell according to the Example is about 13.4% of the luminance of the light emitted through the blue pixel. Assuming that the amount of light emitted by the blue organic light-emitting element is substantially the same as the amount of light emitted through the blue pixel, it is possible to know that the color conversion efficiency by the color conversion pattern in the green pixel in which the recess pattern is formed in the organic layer, the anode electrode and the cathode electrode is 13.4%.

Further, it is possible to check that the luminance of the light emitted through the red pixel of the test cell according to the Example is about 25.1% of the luminance of the light emitted through the blue pixel. That is, it is possible to know that the color conversion efficiency by the color conversion pattern in the red pixel in which the recess pattern is formed in the organic layer, the anode electrode and the cathode electrode is 25.1%.

Next, referring to FIG. 26, it is possible to check that the luminance of the light emitted through the green pixel of the test cell according to the comparative example is about 9.3% of the luminance of the light emitted through the blue pixel. That is, it is possible to know that the color conversion efficiency by the color conversion pattern in the organic layer having a flat surface without the uneven pattern, and the green pixel having the anode electrode and the cathode electrode is only 9.3%.

Further, it is possible to check that the luminance of the light emitted through the red pixel of the test cell according to the comparative example is about 16.5% of the luminance of the light emitted through the blue pixel. That is, it is possible to know that the color conversion efficiency by the color conversion pattern in the organic layer having a flat surface without the uneven pattern, and the red pixel having the anode electrode and the cathode electrode is only 16.5%.

Comparing the results of FIGS. 25 and 26, it is can be determined that the uneven patterns formed on the organic layer, the anode electrode, and/or the cathode electrode improve the color conversion efficiency of the quantum dot material by about 50%. That is, the uneven patterns can contribute to the brightness enhancement effect of the display device. This is because the light emitted from the organic light-emitting layer is partly scattered by the uneven pattern (e.g., by the recess pattern), and the light path penetrating the color conversion pattern increases. Thus, the color of much more amount of light is converted. However, the present invention is not limited thereto.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

While the present invention has been particularly illustrated and described with reference to exemplary embodiments thereof, it will be understood by those of ordinary skill in the art that various suitable changes in form and detail may be made therein without departing from the spirit and scope of the present invention as defined by the following claims and equivalents thereof. The exemplary embodiments should be considered in a descriptive sense only and not for purposes of limitation.

What is claimed is:

1. A display device comprising:
a base substrate;

an organic layer on the base substrate and comprising a pattern region having an uneven pattern formed thereon, and a non-pattern region having a flat surface;
a light-emitting element on the organic layer; and
a color conversion pattern on the light-emitting element and overlapping the pattern region and the non-pattern region.

2. The display device of claim 1, wherein the display device comprises a light-emitting region and a non-light-emitting region,
wherein the pattern region is in the light-emitting region, and
wherein at least a part of the non-pattern region is in the light-emitting region, and at least a part of the non-pattern region is located in the non-light-emitting region.

3. The display device of claim 2, further comprising:
a pixel defining layer between the organic layer and the color conversion pattern and defining an opening corresponding to the light-emitting region,
wherein the pixel defining layer does not overlap the uneven pattern.

4. The display device of claim 3, wherein a horizontal distance between a side surface of the pixel defining layer and the uneven pattern is 0.5 times or more of a minimum distance between the light-emitting element and the color conversion pattern.

5. The display device of claim 4, wherein the horizontal distance between the side surface of the pixel defining layer and the uneven pattern is 10% or more of a width of the light-emitting region.

6. The display device of claim 3, wherein the pixel defining layer partially overlaps the color conversion pattern.

7. The display device of claim 1, wherein the display device comprises a first pixel and a second pixel adjacent to the first pixel, and
wherein a minimum distance between the uneven pattern of the organic layer in the first pixel and the uneven pattern of the organic layer in the second pixel is 1.5 times or more of the minimum distance between the light-emitting element and the color conversion pattern.

8. The display device of claim 1, further comprising:
a thin film transistor between the base substrate and the organic layer,
wherein the organic layer has a through-hole enabling an electrical connection between the light-emitting element and the thin film transistor, and a width on a plane of the through-hole is 5 times or more of a width on a plane of the uneven pattern.

9. The display device of claim 8, wherein the organic layer comprises a positive photosensitive material.

10. The display device of claim 8, wherein the width of the uneven pattern is 2.5 µm or less.

11. The display device of claim 8, wherein a distance between adjacent uneven patterns among a plurality of uneven patterns arranged in any pixel is 0.5 times or more of the width of the uneven pattern.

12. The display device of claim 1, wherein the uneven pattern is a linear or dot-shaped recess pattern, and
wherein a depth of the recess pattern is about 2.0 µm or less.

13. The display device of claim 1, wherein the organic layer comprises a first organic layer, and a second organic layer between the first organic layer and the light-emitting element,
wherein a surface of the first organic layer that is in contact with the second organic layer is flat, and
wherein the second organic layer has the uneven pattern.

14. The display device of claim 13, wherein the uneven pattern of the second organic layer is a recess pattern of a dot shape on a plane, and
wherein the second organic layer comprises a positive photosensitive material.

15. The display device of claim 14, further comprising:
a pixel defining layer between the organic layer and the color conversion pattern and defining an opening corresponding to a pixel of the display device,
wherein the recess pattern of the second organic layer partially exposes a flat surface of the first organic layer, and
wherein the non-pattern region of the second organic layer is in partial contact with the pixel defining layer.

16. The display device of claim 13, wherein the uneven pattern of the second organic layer is a dot-shaped convex pattern on a plane, and
wherein the second organic layer comprises a negative photosensitive material.

17. The display device of claim 16, further comprising:
a pixel defining layer between the organic layer and the color conversion pattern and defining an opening corresponding to a pixel of the display device,
wherein a flat surface of the first organic layer is in contact with the pixel defining layer.

18. The display device of claim 1, wherein the light-emitting element comprises a first electrode and a second electrode opposed to each other, and an organic light-emitting layer interposed therebetween, and
wherein one or more of the first electrode and the second electrode has an uneven surface which overlaps the uneven pattern of the organic layer and has a shape corresponding to the uneven pattern.

19. The display device of claim 1, further comprising:
an encapsulation layer between the light-emitting element and the color conversion pattern and comprising one or more organic layers and one or more inorganic layers;
a barrier layer between the encapsulation layer and the color conversion pattern, the barrier layer being arranged along a surface of the color conversion pattern, and comprising an inorganic material; and
an adhesive layer between the encapsulation layer and the barrier layer and in contact with the inorganic layer of the encapsulation layer and the barrier layer,
wherein the light-emitting element comprises a first electrode in contact with the organic layer, a second electrode on the first electrode, and an organic light-emitting layer interposed between the first electrode and the second electrode.

20. The display device of claim 19, wherein a lowermost layer of the encapsulation layer that is in contact with the second electrode has a partially uneven surface.

21. The display device of claim 19, wherein the organic light-emitting layer comprises:
a first light-emitting layer between the first electrode and the second electrode and configured to emit light having a peak wavelength in a range of about 420 nm to about 490 nm; and
a second light-emitting layer between the first light-emitting layer and the second electrode, and configured to emit light having a peak wavelength in the range of about 420 nm to about 490 nm and having a peak wavelength different from that of the first light-emitting layer.

22. The display device of claim 19, wherein the display device comprises a first pixel, and a second pixel configured to display a color different from the first pixel, and wherein the organic light-emitting layer is configured to emit light of a blue wavelength band having a peak wavelength in a range of about 420 nm to about 490 nm, and the organic light-emitting layer is above the first pixel and the second pixel.

23. The display device of claim 1, wherein the light-emitting element comprises an anode electrode, a cathode electrode, and an organic light-emitting layer interposed therebetween, and wherein the cathode electrode and the color conversion pattern are apart from each other with the anode electrode interposed therebetween.

24. A display device having a plurality of pixels, the display device comprising:

a base substrate;

a light-emitting element on the base substrate, and comprising a first electrode, a second electrode, and an organic light-emitting layer interposed therebetween;

a pixel defining layer on the base substrate and defining an opening corresponding to a pixel of the plurality of pixels; and, a color conversion pattern over the light-emitting element and the pixel defining layer, wherein the first electrode has a pattern region in which a plurality of uneven patterns is formed, and a non-pattern region having a flat surface, wherein the color conversion pattern overlaps the pattern region and the non-pattern region, and wherein the non-pattern region is at least partially between the pattern region and the pixel defining layer.

* * * * *